(12) United States Patent
Saito

(10) Patent No.: US 8,385,105 B2
(45) Date of Patent: Feb. 26, 2013

(54) SEMICONDUCTOR DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 200 days.

(21) Appl. No.: 13/019,344

(22) Filed: Feb. 2, 2011

(65) Prior Publication Data

US 2011/0194332 A1 Aug. 11, 2011

(30) Foreign Application Priority Data

Feb. 5, 2010 (JP) .................................. 2010-024867

(51) Int. Cl.
*G11C 12/24* (2006.01)
(52) U.S. Cl. .................................. 365/149; 365/230.03
(58) Field of Classification Search .................. 365/149, 365/230.03
See application file for complete search history.

(56) References Cited

U.S. PATENT DOCUMENTS

| | | | |
|---|---|---|---|
| 4,466,081 A | 8/1984 | Masuoka |
| 5,297,104 A | 3/1994 | Nakashima |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,674,112 B1 | 1/2004 | Tadaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Michael Tran
(74) *Attorney, Agent, or Firm* — Fish & Richardson P.C.

(57) ABSTRACT

An object is to provide a semiconductor device capable of accurate data retention even with a memory element including a depletion mode transistor. A gate terminal of a transistor for controlling input of a signal to a signal holding portion is negatively charged in advance. The connection to a power supply is physically broken, whereby negative charge is held at the gate terminal. Further, a capacitor having terminals one of which is electrically connected to the gate terminal of the transistor is provided, and thus switching operation of the transistor is controlled with the capacitor.

14 Claims, 20 Drawing Sheets

U.S. PATENT DOCUMENTS

| | | |
|---|---|---|
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0281071 A1 | 12/2005 | Jeon |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1* | 10/2006 | Kimura ..................... 315/169.3 |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Kim et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0148845 A1 | 6/2010 | Kato |
| 2010/0193785 A1 | 8/2010 | Kimura |
| 2010/0276689 A1 | 11/2010 | Iwasaki |
| 2010/0279462 A1 | 11/2010 | Iwasaki |
| 2011/0063891 A1* | 3/2011 | Kajigaya ..................... 365/149 |
| 2011/0063892 A1* | 3/2011 | Kajigaya et al. ............. 365/149 |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0148463 A1 | 6/2011 | Kato et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176354 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0198593 A1 | 8/2011 | Kato et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-005290 A | 1/1990 |
| JP | 05-251705 A | 9/1993 |
| JP | 08-195671 A | 7/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 99/00846 A1 | 1/1999 |
| WO | 2004/114391 A1 | 12/2004 |
| WO | 2007/029844 A1 | 3/2007 |

OTHER PUBLICATIONS

Asaoka, Y et al., "29.1: Polarizer-Free Reflective LCD Combined With Ultra Low-Power Driving.Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLDCS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5Δ) Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn, J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartee-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Phyiscal Review Letters), Jul. 31, 2000, vol. 85, No. 5, pp. 1012-1015.

International Search Report, PCT Application No. PCT/JP2011/050600, dated Apr. 19, 2011, 5 pages.

Written Opinion, PCT Application No. PCT/JP2011/050600, dated Apr. 19, 2011, 6 pages.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

* cited by examiner

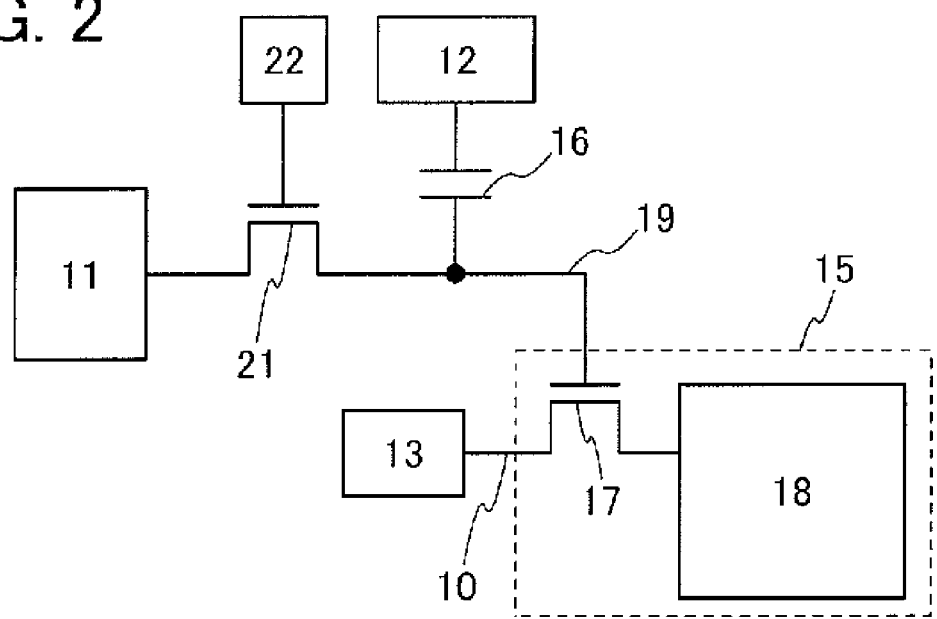

1500

1500

1500

1500

1500

1500

SEMICONDUCTOR DEVICE

TECHNICAL FIELD

The present invention relates to a semiconductor device using a semiconductor element. The present invention particularly relates to a semiconductor device having a memory device that includes a semiconductor element (also referred to as a semiconductor memory device). Note that the semiconductor device in this specification means a general device that can operate by utilizing semiconductor characteristics.

BACKGROUND ART

Memory devices using semiconductor elements are broadly classified into two categories: volatile devices which lose stored data when supply of power stops, and non-volatile devices which retain stored data even when power is not supplied.

A typical example of volatile memory devices is a DRAM (a dynamic random access memory). A DRAM stores data in such a manner that a transistor included in a memory element is selected and electric charge is accumulated in a capacitor.

On the basis of the above-described principle, in a DRAM, since charge in a capacitor is lost when data is read, it is necessary to perform writing again so that data is stored again every time data is read. In addition, a transistor included in a memory element has leakage current and charge flows into or out of the capacitor even when the transistor is not selected, whereby data retention period is short. For that reason, another writing operation (refresh operation) is necessary at predetermined intervals, and it is difficult to sufficiently reduce power consumption. Furthermore, since stored data is lost when supply of power stops, an additional memory device using a magnetic material or an optical material is needed in order to hold the data for a longer period.

Another example of volatile memory devices is an SRAM (a static random access memory). An SRAM retains stored data by using a circuit such as a flip-flop and thus does not need refresh operation. This means that an SRAM has an advantage over a DRAM. However, cost per storage capacitance is increased because a circuit such as a flip-flop is used. Moreover, as in a DRAM, stored data in an SRAM is lost when supply of power stops.

A typical example of non-volatile memory devices is a flash memory. A flash memory has a floating gate between a gate electrode and a channel formation region in a transistor, and stores data by holding charge in the floating gate. Accordingly, a flash memory has advantages in that the data retention period is extremely long (semi-permanent) and refresh operation which is necessary for a volatile memory device is not needed (e.g., see Patent Document 1).

However, because a gate insulating layer included in a memory element deteriorates by tunneling current generated in writing, the memory element stops its function after a predetermined number of writing operations. In order to reduce adverse effects of this problem, a method in which the number of writing operations for memory elements is equalized is employed, for example. However, a complicated peripheral circuit is needed to realize this method. Moreover, employing such a method does not solve the fundamental problem of lifetime. That is, a flash memory is not suitable for applications in which data is frequently rewritten.

In addition, high voltage is necessary for holding charge in the floating gate or removing the charge, and a circuit therefor is required. Further, it takes a relatively long time to hold or remove charge, and it is not easy to perform writing and erasing at higher speed.

As semiconductor thin films applicable to the above-described thin film transistors, silicon-based semiconductor materials have been commonly used, but oxide semiconductors have been attracting attention as alternative materials. Transistors having oxide semiconductors can be manufactured through the same low temperature process through which transistors having amorphous silicon are manufactured, and have higher field-effect mobility than transistors having amorphous silicon. Therefore transistors having oxide semiconductors have been expected to be semiconductor elements that could replace or excel transistors having amorphous silicon.

REFERENCE

[Patent Document 1] Japanese Published Patent Application No. S57-105889

DISCLOSURE OF INVENTION

However, the technology for controlling electrical characteristics such as threshold voltage has been established in the field of transistors having silicon-based semiconductor materials, but not yet in the field of transistors having oxide semiconductor materials. Specifically, threshold voltage control by, for example, doping with impurities can be achieved for transistors having silicon-based semiconductor materials, but such control involves difficulty for transistors having oxide semiconductor materials.

Accordingly, an object of one embodiment of the present invention is to provide a semiconductor device having a memory device which is capable of accurate data retention in the memory element, even when the memory device has a memory element including transistors which show significant variations of threshold voltage, or which have negative threshold voltage (which are depletion mode transistors).

In the semiconductor device of one embodiment of the present invention, a gate terminal of a transistor for controlling input of a signal to a signal holding portion is negatively charged in advance, and negative charge is held at the gate terminal. Further, a capacitor having terminals one of which is electrically connected to the gate terminal of the transistor is provided, and thus switching operation of the transistor is controlled with the capacitor.

Specifically, one embodiment of the present invention is a semiconductor device which includes: a negatively charged word line; a bit line; a memory element including a transistor and a signal holding portion in which a gate terminal of the transistor is electrically connected to the word line, one of a source terminal and a drain terminal of the transistor is electrically connected to the bit line, and the other of the source and drain terminals is electrically connected to the signal holding portion; a capacitor including terminals one of which is electrically connected to the word line; a word line driver circuit controlling potential of the other of the terminals of the capacitor; and a bit line driver circuit controlling potential of the bit line.

In the semiconductor device of one embodiment of the present invention, the gate terminal of a transistor for controlling input of a signal to the signal holding portion is negatively charged in advance, and negative charge is held at the gate terminal negative charge. Thus, an off state can be kept even when the transistor is a depletion mode transistor. The semiconductor device of one embodiment of the present invention also includes the capacitor having terminals one of which is electrically connected to the gate terminal of the transistor. Accordingly, the potential of the gate terminal of the transistor can be held for a long period. Further, by control of the potential of the other of the terminals of the capacitor, switching operation of the transistor can be controlled. Hence, even with a memory element including a depletion mode transistor, the semiconductor device of one embodiment of the present invention is capable of accurate data retention in the memory element.

BRIEF DESCRIPTION OF DRAWINGS

FIG. 2 illustrates a semiconductor device according to Embodiment 2.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiment modes and the embodiment below.

Embodiment 1

Figure 1A:
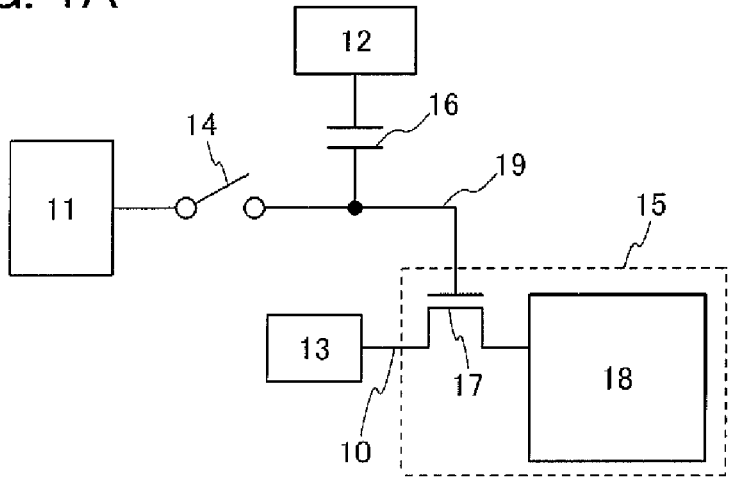
FIGS. 1A to 1C illustrate a semiconductor device according to Embodiment 1.
Figure 1B:
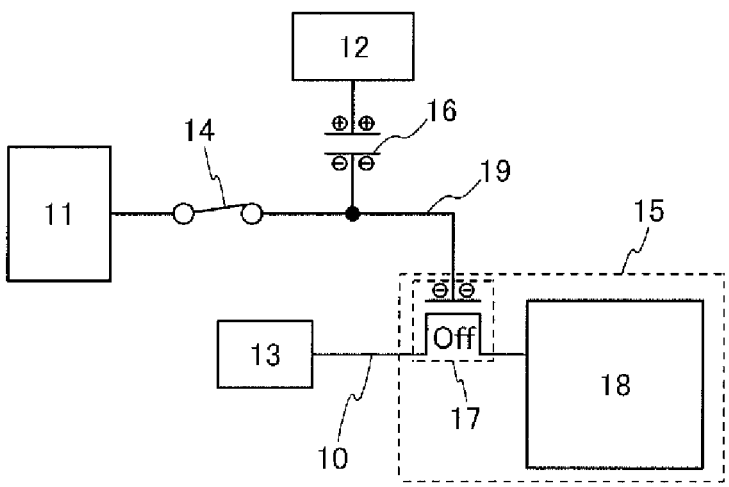
Figure 1C:
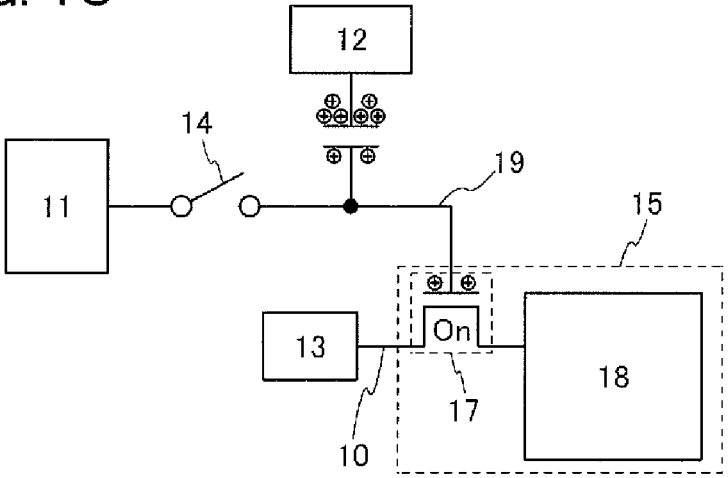

This embodiment gives an example of a semiconductor device having a memory device with reference to FIGS. 1A to 1C.

FIG. 1A illustrates a structure of a semiconductor device of this embodiment. The semiconductor device illustrated in FIG. 1A includes a word line 19, a bit line 10, a power supply circuit 11, a word line driver circuit 12, a bit line driver circuit 13 for controlling a potential of the bit line 10, a switch 14 having terminals one of which is electrically connected to the power supply circuit 11 and the other of which is electrically connected to the word line 19, a memory element 15 electrically connected to the word line 19 and the bit line 10, and a capacitor 16 having terminals one of which is electrically connected to the word line 19 and the other of which is electrically connected to the word line driver circuit 12. Note that the word line driver circuit 12 controls a potential of the word line 19 by controlling a potential of the other of the terminals of the capacitor 16; i.e. the word line driver circuit 12 controls a potential of the word line 19 by using capacitive coupling. Further, the memory element 15 includes a transistor 17 having a gate terminal electrically connected to the word line 19 and a source terminal and a drain terminal one of which is electrically connected to the bit line 10. The memory element 15 also includes a signal holding portion 18 electrically connected to the other of the source and drain terminals of the transistor 17. Note that the transistor 17 is an n-channel transistor. For the switch 14, it is possible to apply, for example, a transistor, an MEMS switch, or a method in which electrical connection between the word line 19 and a needle provided in the power supply circuit 11 is controlled. For the switch 14, it is also possible to apply a method in which electrical connection between the power supply circuit 11 and the word line 19 is broken by laser cutting.

In the semiconductor device of this embodiment, a signal outputted from the bit line driver circuit 13 can be held in the memory element 15. In other words, in the memory element 15, the transistor 17 functions as a switch controlling input of a signal outputted from the bit line driver circuit 13 to the signal holding portion 18, and the signal holding portion 18 has a function of holding the inputted signal.

The operation period of the semiconductor device of this embodiment includes a period in which the word line 19, one of the terminals of the capacitor 16, and the gate terminal of the transistor 17 are negatively charged (a charge period). Further, the operation period of the semiconductor device of this embodiment includes a period in which a signal is inputted to the signal holding portion 18 (a writing period) after the charge period.

FIG. 1B illustrates the semiconductor device of this embodiment in the charge period. In the charge period, the switch 14 is on, the power supply circuit 11 outputs a power source potential which is a negative potential, and the word line driver circuit 12 outputs a potential that is higher than the potential outputted from the power supply circuit 11. Consequently, one of the terminals of the capacitor 16 is negatively charged, and the other of the terminals is positively charged. Further, the word line 19, which is electrically connected to one of the terminals of the capacitor 16, and the gate terminal of the transistor 17 are negatively charged. Note that the transistor 17 is off at this time.

FIG. 1C illustrates the semiconductor device of this embodiment in the writing period. In the writing period, the switch 14 is off, and the word line driver circuit 12 outputs a higher potential than in the charge period. Consequently, a node where the word line 19, one of the terminals of the capacitor 16, and the gate terminal of the transistor 17 are connected is in a floating state, so that the potential of the node is increased by the capacitive coupling. At this time, the transistor 17 is on.

In the semiconductor device of this embodiment, the gate terminal of transistor 17 is electrically connected to one of the terminals of the capacitor 16, whereby the potential of the gate terminal can be held for a long period. For example, negative charge can be held at the gate terminal for an extended period. Further, by control of the potential of the other of the terminals of the capacitor 16, switching operation of the transistor 17 can be controlled. The semiconductor device of this embodiment is thus capable of easily controlling switching operation of the transistor 17, even when the transistor 17 is a depletion mode transistor. As a result, a signal can be accurately inputted to and held in the memory element 15.

All or part of this embodiment can be combined with all or part of another embodiment as appropriate.

Embodiment 2

This embodiment gives an example of the semiconductor device having a memory device with reference to FIG. 2.

FIG. 2 illustrates a structure of a semiconductor device of this embodiment. The semiconductor device illustrated in FIG. 2 is a semiconductor device obtained by modifications to the semiconductor device illustrated in FIG. 1A in such a manner that the switch 14 is replaced with a transistor 21 and a power supply circuit 22 is added. Specifically, in the transistor 21, one of a source terminal and a drain terminal is electrically connected to the power supply circuit 11, and the other of the source and drain terminals is electrically connected to the word line 19. Further, the power supply circuit 22 is electrically connected to the gate terminal of the transistor 21. Note that the transistor 21 is an n-channel transistor.

The operation period of the semiconductor device of this embodiment includes a charge period and a writing period, like that of the semiconductor device described in Embodiment 1. Note that operations of the semiconductor device of Embodiment 2 in the charge period and the writing period are the same as those of the semiconductor device of Embodiment 1. In other words, the power supply circuit 22 outputs a high-level power source potential in the charge period and outputs a low-level power source potential in the writing period. Consequently, the transistor 21 is on in the charge period and is off in the writing period. Note that operations of the other components included in the semiconductor device are already described in Embodiment 1 and can be applied to this embodiment.

The semiconductor device of this embodiment has the same effect as the semiconductor device described in Embodiment 1. Furthermore, the semiconductor device of Embodiment 2 includes the transistor 21 as the switch 14 which is included in the semiconductor device described in Embodiment 1. Thus, for the semiconductor device described in Embodiment 2, the transistor 17 and the transistor 21 can be formed in the same step. Accordingly, it is possible to reduce the cost of producing semiconductor devices and improve yield owing to a reduction in production steps.

All or part of this embodiment can be combined with all or part of another embodiment as appropriate.

Embodiment 3

This embodiment gives an example of the semiconductor device having a memory device with reference to FIGS. 3A and 3B, FIGS. 4A and 4B, and FIGS. 5A and 5B.

Figure 3A:
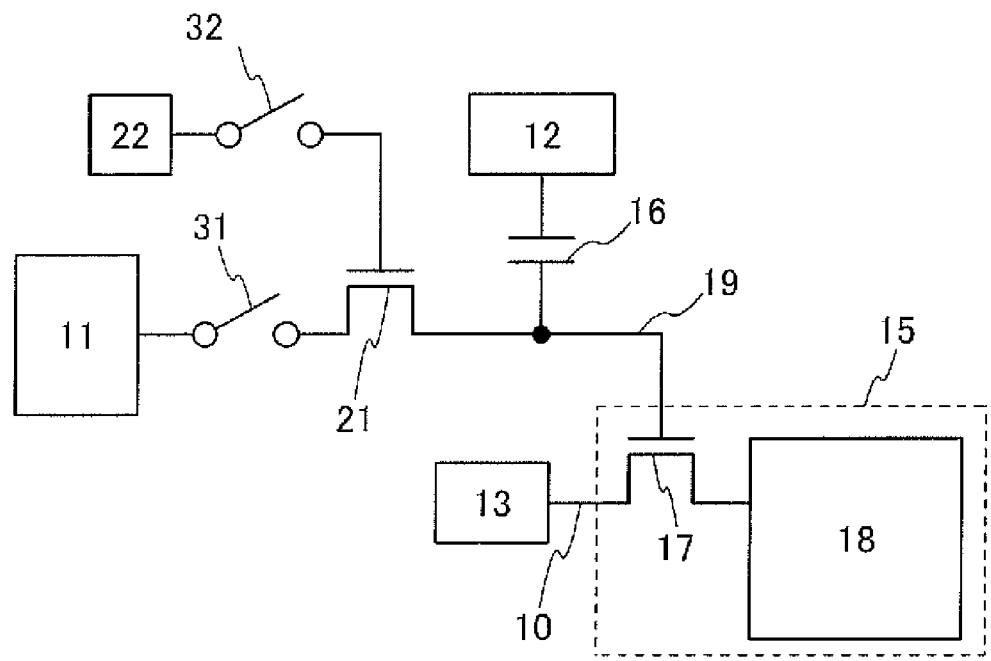
FIGS. 3A and 3B illustrate a semiconductor device according to Embodiment 3.

FIG. 3A illustrates a structure of a semiconductor device of this embodiment. The semiconductor device illustrated in FIG. 3A is a semiconductor device obtained by a modification to the semiconductor device illustrated in FIG. 2 in such a manner that a switch 31 is added between the power supply circuit 11 and one of the source and drain terminals of the transistor 21 and that a switch 32 is added between the gate terminal of the transistor 21 and the power supply circuit 22. In other words, the semiconductor device illustrated in FIG. 3A is a semiconductor device that includes, in addition to the structure of the semiconductor device illustrated in FIG. 2, the switch 31, having terminals one of which is electrically connected to the power supply circuit 11 and the other of which is electrically connected to one of the source and drain terminals of the transistor 21, and includes the switch 32, having terminals one of which is electrically connected to the power supply circuit 22 and the other of which is electrically connected to the gate terminal of the transistor 21. For the switch 31, it is possible to apply, for example, a transistor, an MEMS switch, or a method in which electrical connection between a needle provided in the power supply circuit 11 and one of the source and drain terminals of the transistor 21 is controlled. For the switch 32, it is similarly possible to apply, for example, a transistor, an MEMS switch, or a method in which electrical connection between a needle provided in the power supply circuit 22 and the gate terminal of the transistor 21 is controlled. For the switch 31, it is also possible to apply a method in which the electrical connection between the power supply circuit 11 and one of the source and drain terminals of the transistor 21 is broken by laser cutting. Also for the switch 32, it is possible to apply a method in which the electrical connection between the power supply circuit 22 and the gate terminal of the transistor 21 is broken by laser cutting.

The operation period of the semiconductor device of this embodiment includes a charge period and a writing period, like those of the semiconductor devices described in Embodiment 1 and 2. Furthermore, the operation period of the semiconductor device of Embodiment 3 includes first to third transition periods between the charge period and the writing period.

Figure 3B:
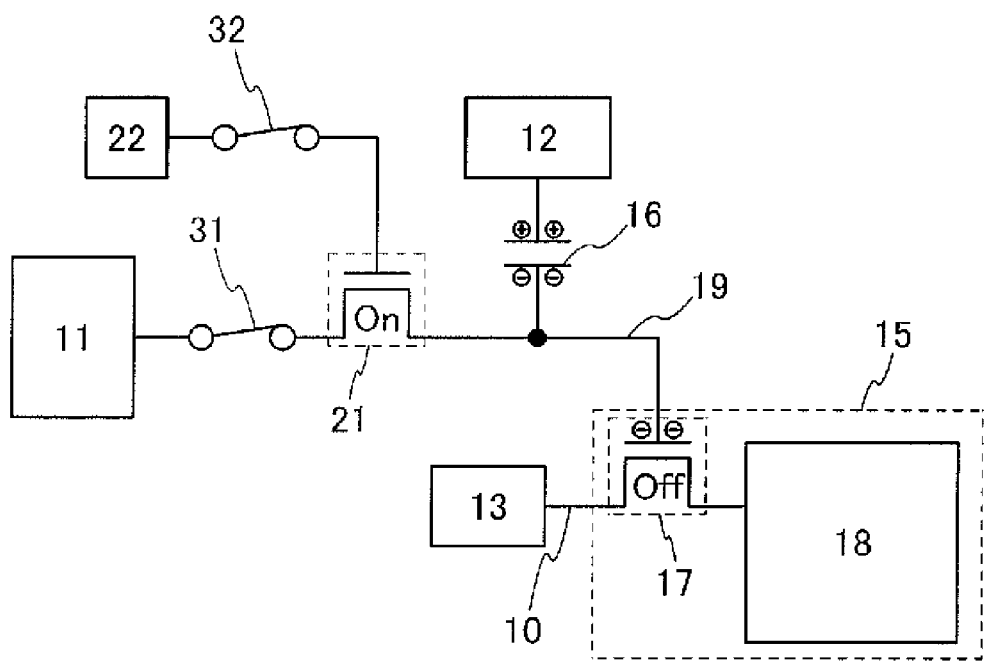

FIG. 3B illustrates the semiconductor device of this embodiment in the charge period. In the charge period, the switches 31 and 32 are turned on, the power supply circuit 11 outputs a power source potential which is a negative potential, the word line driver circuit 12 outputs a power source potential that is higher than the potential outputted from the power supply circuit 11, and the power supply circuit 22 outputs a power source potential that is higher than the sum of the power source potential outputted from the power supply circuit 11 and the threshold voltage of the transistor 21. For example, if the power source potential outputted from the power supply circuit 11 is −2V and the threshold voltage of the transistor 21 is −1V, the power source potential outputted from the power supply circuit 22 is a potential higher than −3V. The transistor 21 is on as a result. Thus, one of the terminals of the capacitor 16 is negatively charged, and the other of the terminals is positively charged. Further, the word line 19 and the gate terminal of the transistor 17 which are at the same node as one of the terminals of the capacitor 16 are negatively charged. Note that the transistor 17 is off at this time.

Figure 4A:
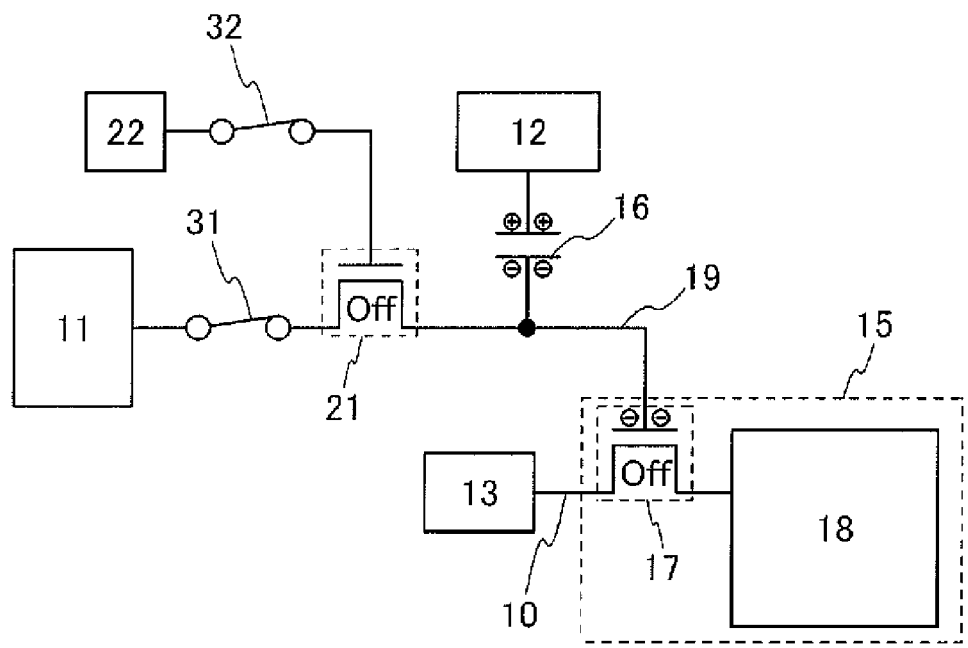
FIGS. 4A and 4B illustrate a semiconductor device according to Embodiment 3.

FIG. 4A illustrates the semiconductor device of this embodiment in the first transition period. In the first transition period, the power source potential outputted from the power supply circuit 22 decreases. Specifically, the power source potential outputted from the power supply circuit 22 is lower than the sum of the power source potential outputted from the power supply circuit 11 and the threshold voltage of the transistor 21. For example, if the power source potential outputted from the power supply circuit 11 is −2V and the threshold voltage of the transistor 21 is −1V, the power source potential outputted from the power supply circuit 22 is a potential lower than −3V. The transistor 21 is off as a result. Thus, each of the word line 19, one of the terminals of the capacitor 16, and the gate terminal of the transistor 17 is in a floating state.

Figure 4B:
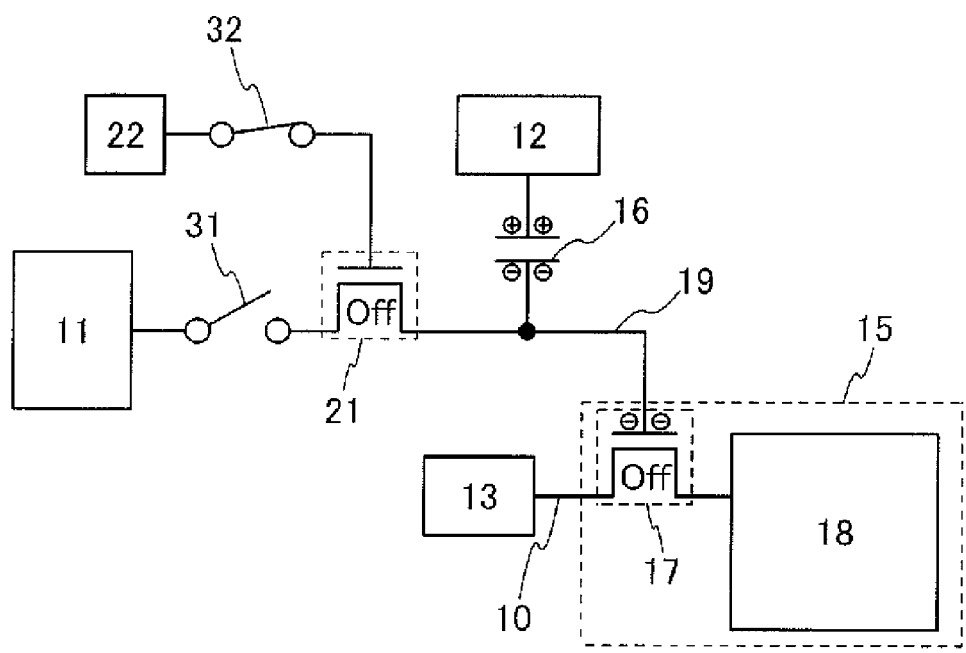

FIG. 4B illustrates the semiconductor device of this embodiment in the second transition period. In the second transition period, the switch 31 is off. In this case, the transistor 21 is held off. Accordingly, it is possible to reduce adverse effects of switching operation by the switch 31 on the potentials of the word line 19, one of the terminals of the capacitor 16, and the gate terminal of the transistor 17.

Figure 5A:
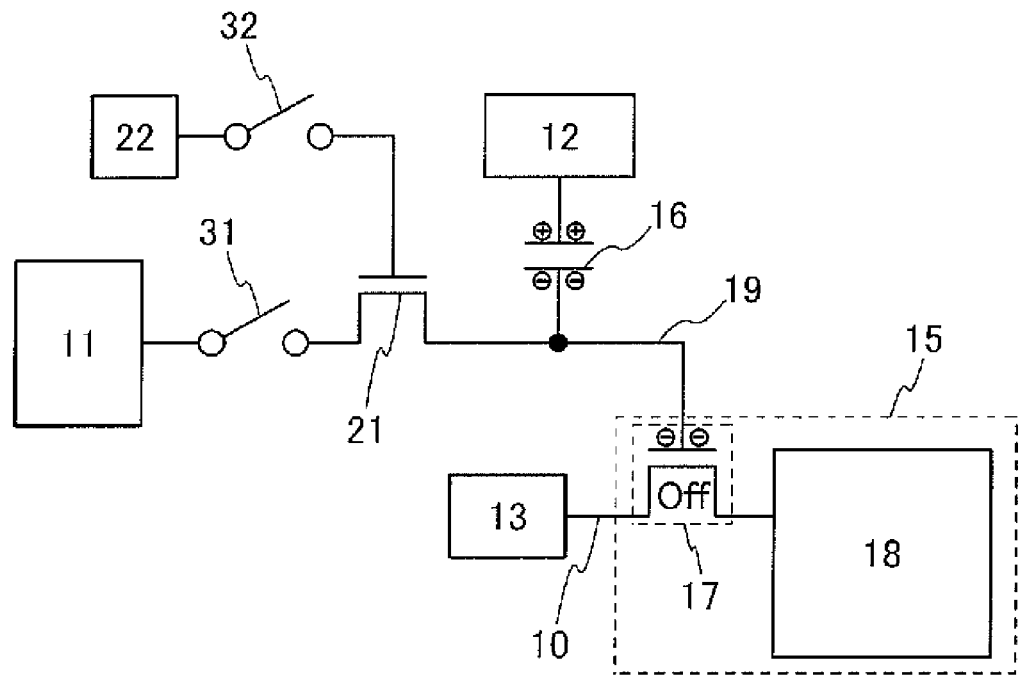
FIGS. 5A and 5B illustrate a semiconductor device according to Embodiment 3.

FIG. 5A illustrates the semiconductor device of this embodiment in the third transition period. In the third transition period, the switch 32 is off. Thus, each of the gate terminal, the source terminal, and the drain terminal of the transistor 21 is in a floating state. Consequently, the transistor 21 could be possibly on. Note that the electrical connection between the power supply circuit 11 and one of the source and drain terminals of the transistor 21 is broken. Accordingly, even if the transistor 21 is on, it is possible to reduce adverse effects on the potentials of the word line 19, one of the terminals of the capacitor 16, and the gate terminal of the transistor 17.

Figure 5B:
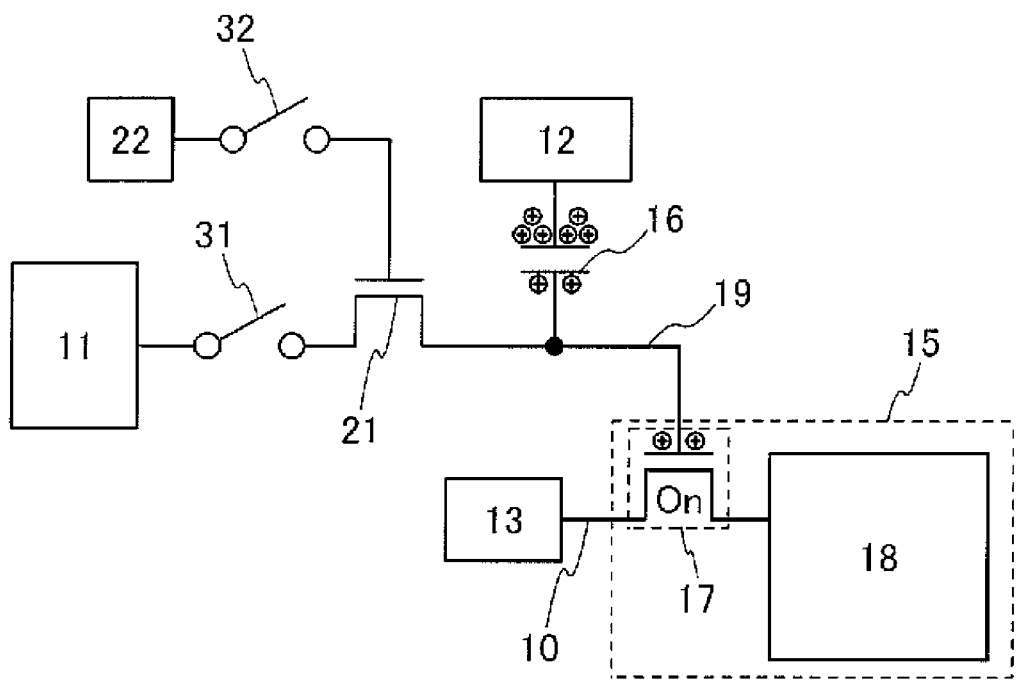

FIG. 5B illustrates the semiconductor device of this embodiment in the writing period. In the writing period, the word line driver circuit 12 outputs a higher power source potential than in the charge period. Consequently, the potentials of the word line 19, one of the terminals of the capacitor 16, and the gate terminal of the transistor 17 is increased by the capacitive coupling with the other of the terminals of the capacitor 16. At this time, the transistor 17 is on.

The semiconductor device of this embodiment has the same effect as the semiconductor devices described in Embodiment 1 and 2. Further, the semiconductor device of Embodiment 3 is a semiconductor device obtained by a modification to the semiconductor device described in Embodiment 2 in such a manner that the switches 31 and 32 are added. In the semiconductor device of this embodiment, by control of the switches 31 and 32 as described above, variations in the potentials of one of the terminals of the capacitor 16 and the gate terminal of transistor 17 can be reduced. Therefore, in the semiconductor device of this embodiment, a signal can be inputted to and held in the memory element 15 more accurately than in the semiconductor devices of Embodiments 1 and 2.

All or part of this embodiment can be combined with all or part of another embodiment as appropriate.

Embodiment 4

Figure 6A:
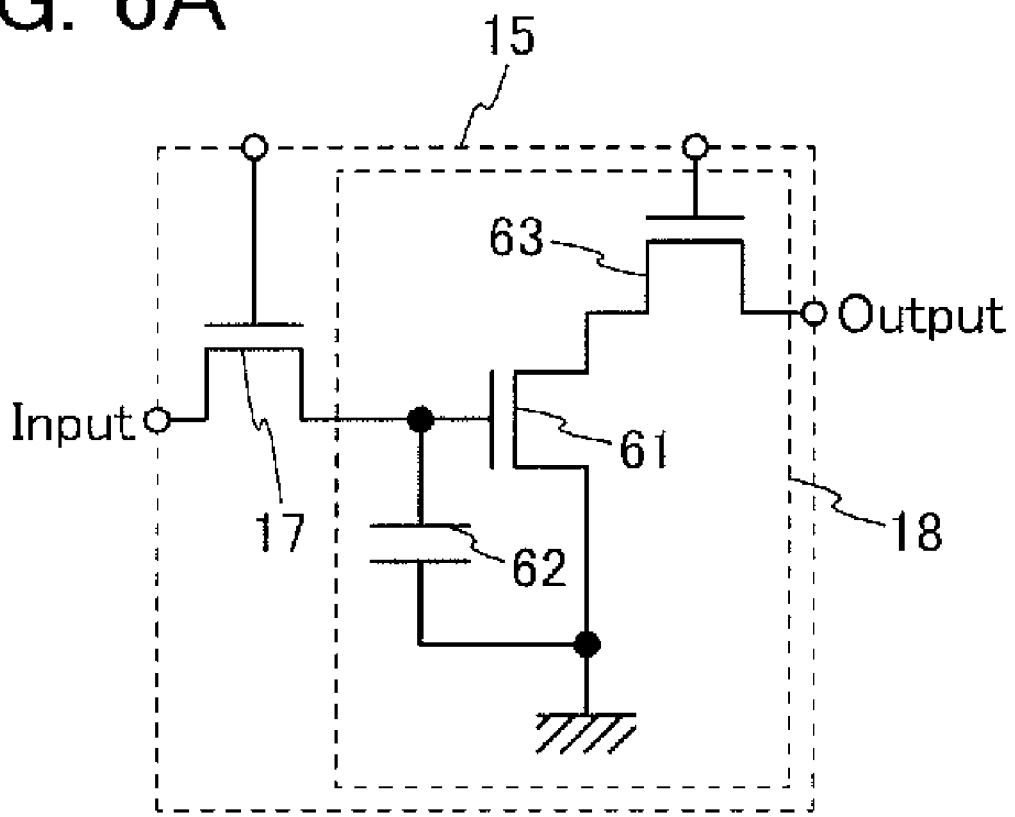
FIGS. 6A and 6B illustrate a semiconductor device according to Embodiment 4.
Figure 6B:
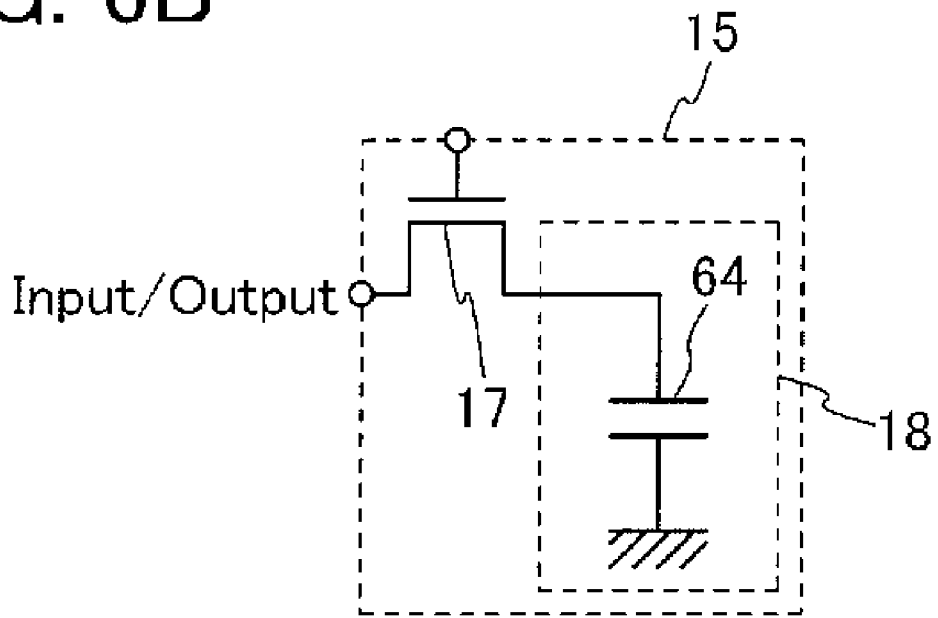

This embodiment gives an example of the semiconductor device having a memory device referring to FIGS. 6A and 6B. Specifically, an example of the memory elements included in the semiconductor devices of Embodiments 1 to 3 is described with reference to FIGS. 6A and 6B.

FIG. 6A illustrates an example of a structure of the memory element 15. The memory element 15 has the transistor 17 and the signal holding portion 18. Furthermore, the signal holding portion 18 includes the following components: a transistor 61 having a gate terminal electrically connected to the other of the source and drain terminals of the transistor 17, and having a source terminal and a drain terminal one of which is grounded; a capacitor 62 having terminals one of which is electrically connected to the other of the source and drain terminals of the transistor 17 and the other of which is grounded; and a transistor 63 having a gate terminal electrically connected to a control terminal and having a source terminal and a drain terminal one of which is electrically connected to one of the source and drain terminals of the transistor 61 and the other of which is electrically connected to an output terminal.

In the memory element 15 illustrated in FIG. 6A, the transistor 17 is on and a signal is inputted to the signal holding portion 18 in the writing period, as described in Embodiments 1 to 3. Specifically, the signal is inputted to the gate terminal of the transistor 61 and one of the terminals of the capacitor 62. Note that the signal is a binary signal (having a potential higher than the threshold voltage of the transistor 61 and a potential lower than the threshold voltage of the transistor 61). That is, which one of the two values the signal is determines the state (on or off state) of the transistor 61.

In a reading period in which a signal is read from the memory element 15 illustrated in FIG. 6A, a high potential signal is inputted from the control terminal to the gate terminal of the transistor 63, so that the transistor 63 is on. At this time, by forming a divider circuit having the transistor 61 as a resistor, a signal held in the memory element 15 can be identified. Specifically, the potential of a signal outputted from the divider circuit is low when the transistor 61 is on, or the potential of this signal is high when the transistor 61 is off. By the identification of the outputted signal, the signal held in the memory element 15 can be identified.

FIG. 6B illustrates an example of a structure of the memory element 15. The memory element 15 has the transistor 17 and the signal holding portion 18. Furthermore, the signal holding portion 18 includes a capacitor 64 having terminals one of which is electrically connected to the other of the source and drain terminals of the transistor 17 and the other of the terminals of which is grounded. Note that one of the source and drain terminals of the transistor 17 functions as an input-output terminal of the memory element 15.

In the memory element 15 illustrated in FIG. 6B, the transistor 17 is on and a signal is inputted to the signal holding portion 18 in the writing period, as described in Embodiments 1 to 3. Specifically, the signal is inputted to one of the terminals of the capacitor 64.

In the reading period in which a signal is read from the memory element 15 illustrated in FIG. 6B, the transistor 17 is on as in the writing period. At this time, a signal held in the capacitor 64 is outputted from one of the source and drain terminals of the transistor 17.

All or part of this embodiment can be combined with all or part of another embodiment as appropriate.

Embodiment 5

Figure 7:
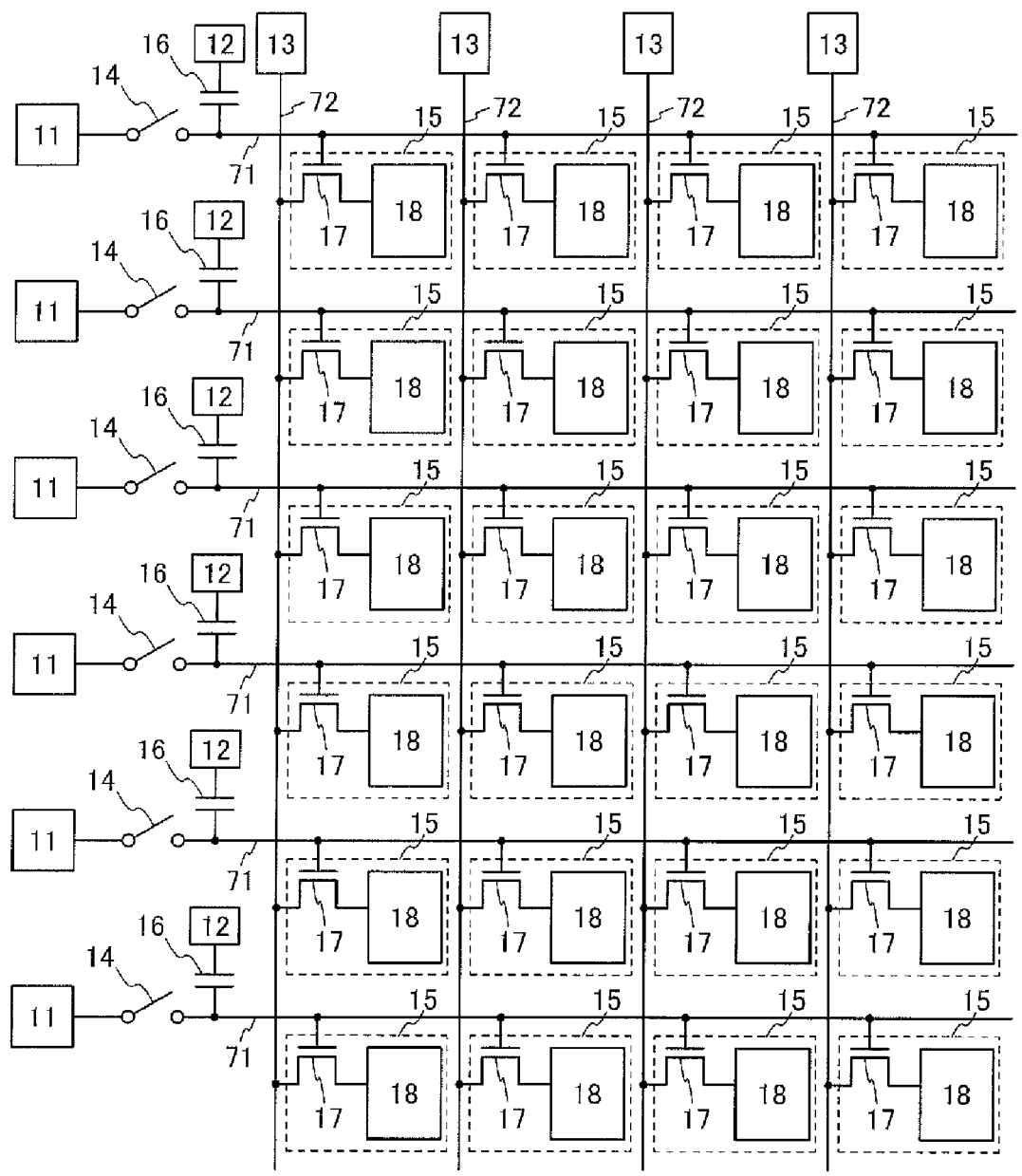
FIG. 7 illustrates a semiconductor device according to Embodiment 5.
Figure 8:
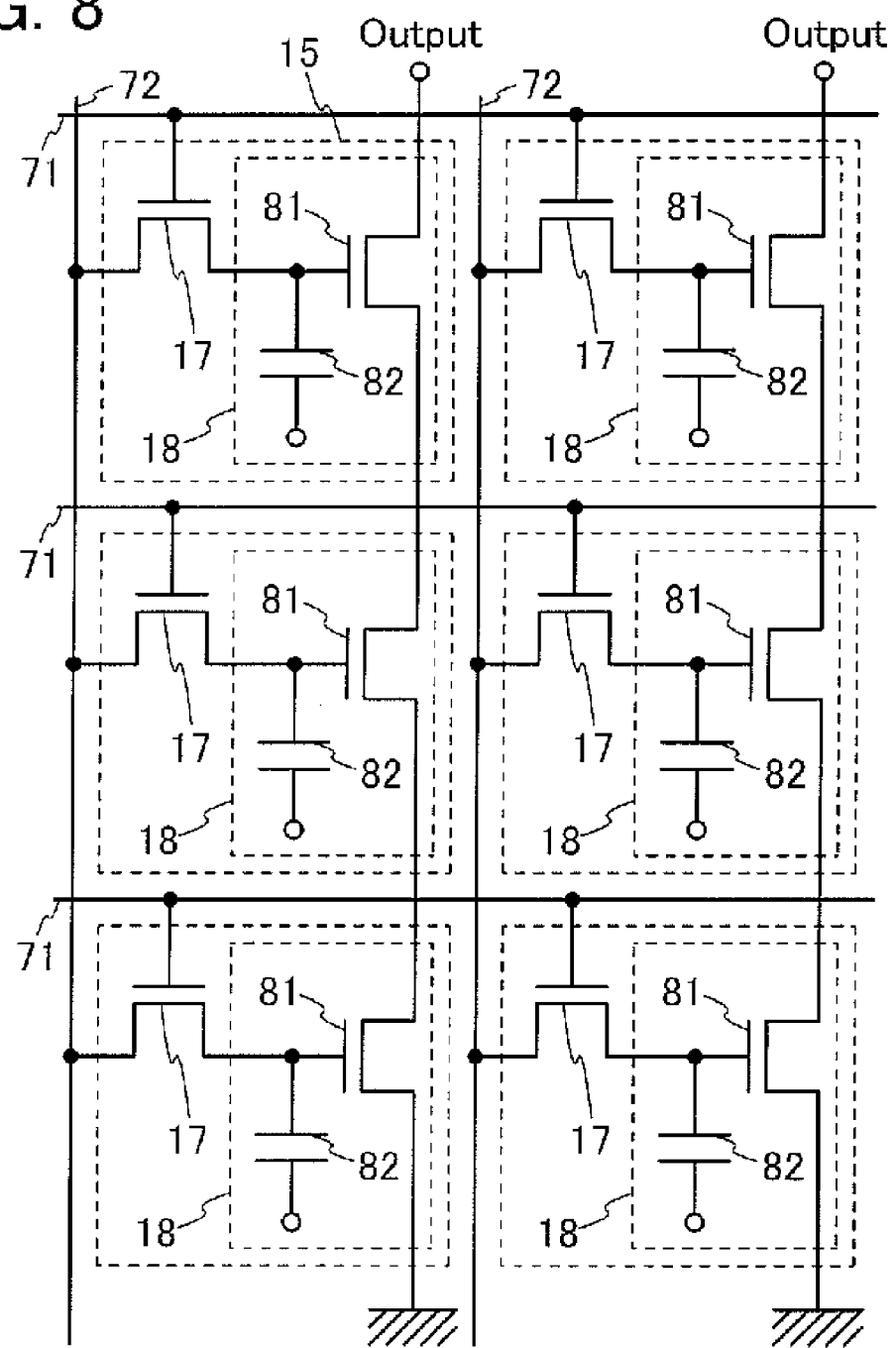
FIG. 8 illustrates a semiconductor device according to Embodiment 5.
Figure 9:
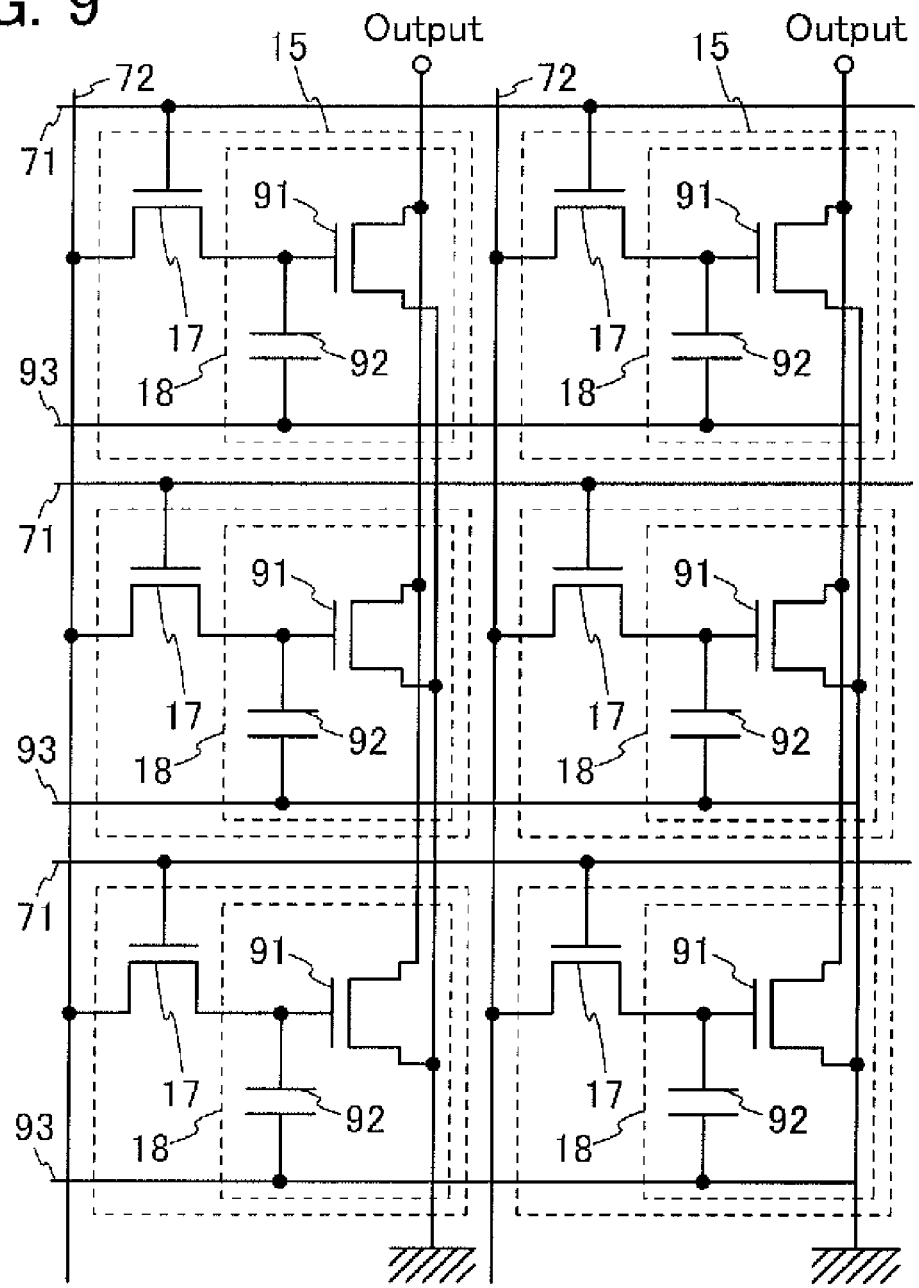
FIG. 9 illustrates a semiconductor device according to Embodiment 5.

This embodiment gives examples of the semiconductor device having a memory device with reference to FIG. 7, FIG. 8 and FIG. 9. Specifically, examples of a semiconductor device having a plurality of memory elements are described with reference to FIG. 7, FIG. 8 and FIG. 9.

FIG. 7 illustrates a structure of a semiconductor device of this embodiment. The semiconductor device illustrated in FIG. 7 includes the following components: a plurality of memory elements 15 arranged in matrix; a plurality of word lines 71 each electrically connected to the gate terminals of the transistors 17 included in memory elements 15 arranged in a certain row among the memory elements 15 arranged in matrix; and a plurality of bit lines 72 each electrically connected to one of the drain terminal and the source terminal of the transistors 17 included in memory elements 15 arranged in a certain column among the memory elements 15 arranged in matrix. Note that the potential of each word line 71 is controlled by the power supply circuit 11, the word line driver circuit 12, the switch 14, and the capacitor 16. Further, a signal is inputted from the bit line driver circuit 13 to each bit line 72.

By operating as described in Embodiment 1, the semiconductor device of this embodiment is capable of easily controlling switching operation of the transistor 17, even when the transistor 17 included in each memory element 15 is a depletion mode transistor. As a result, a signal can be accurately inputted to and held in the memory element 15. A specific structure of the plurality of memory elements 15 included in the semiconductor device of this embodiment and their operation in the reading period are explained below.

FIG. 8 illustrates an example of the structure of the plurality of memory elements 15. Each memory element 15 has the transistor 17 and the signal holding portion 18. Furthermore, the signal holding portion 18 includes a transistor 81 having a gate terminal electrically connected to the other of the source and drain terminals of the transistor 17, and includes a capacitor 82 having terminals one of which is electrically connected to the other of the source and drain terminals of the transistor 17 and to the gate terminal of the transistor 81. Further, in two memory elements 15 adjacent in the column direction, one of a source terminal and a drain terminal of the transistor 81 that is included in one of the memory elements 15 is electrically connected to the other of a source terminal and a drain terminal of the transistor 81 that is included in the other of the memory elements 15. Note that in the memory elements 15 arranged in the same column, one of a source terminal and a drain terminal of the transistor 81 included in the memory element 15 that is located at one of the ends of the column is grounded, and the other of a source terminal and a drain terminal of the transistor 81 included in the memory element 15 that is located at the other of the ends of the column is electrically connected to the output terminal. Furthermore, the other of the terminals of the capacitor 82 included in each memory element 15 is electrically connected to the control terminal.

In each of the plurality of memory elements 15 illustrated in FIG. 8, the transistor 17 is on and a signal is inputted to the signal holding portion 18 in the writing period, as described in Embodiment 1. Specifically, the signal is inputted to the gate terminal of the transistor 81 and one of the terminals of the capacitor 82. Note that the signal is a binary signal (having a potential higher than the threshold voltage of the transistor 81 and a potential lower than the threshold voltage of the transistor 81). That is, which one of the two values the signal is determines the state (on or off state) of the transistor 81.

An operation in the reading period in which a signal is read from the selected one memory element 15 among the plurality of memory elements 15 illustrated in FIG. 8 is next explained.

First, one of the source and drain terminals of the transistor 81 included in one selected memory element 15 is supplied with a ground potential, and the other of the source and drain terminals is electrically connected to the output terminal. This is performed in such a manner that the transistors 81 are on in all the memory elements 15 except the selected one among the plurality of memory elements 15 arranged in the column direction. Specifically, a high potential is inputted from the control terminal to the other of the terminals of the capacitor 82 included in each memory element 15. Consequently, the potentials of one of the terminals of the capacitor 82 and the gate terminal of the transistor 81 are increased by the capacitive coupling. Here, these potentials are set to higher than the threshold voltage of the transistors 81, whereby the transistors 81 can be on. At this time, by forming a divider circuit having the transistor 81 as a resistor which is included in one selected memory element 15, a signal held in the memory element 15 can be identified. Specifically, the potential of a signal outputted from the divider circuit is low when the transistor 81 included in one selected memory element 15 is on, the potential of this signal is high when the transistor 81 included in one selected memory element 15 off. By the identification of the outputted signal, the signal held in one selected memory element 15 can be identified.

FIG. 9 illustrates an example of the structure of the plurality of memory elements 15. Each memory element 15 has the transistor 17 and the signal holding portion 18. Furthermore, the signal holding portion 18 includes a transistor 91 having a gate terminal electrically connected to the other of the source and drain terminals of the transistor 17, and includes a capacitor 92 having terminals one of which is electrically connected to the other of the source and drain terminals of the transistor 17 and the other of which is electrically connected to a reading word line 93. Note that each reading word line 93 is electrically connected to the other of the terminals of each of the capacitors 92 included in all the memory elements 15 arranged in a certain row. In addition, one of a source terminal and a drain terminal of the transistor 91 included in all the memory elements 15 arranged in a certain column is grounded, and the other of the source and drain terminals is electrically connected to a predetermined output terminal.

In each memory element 15 illustrated in FIG. 9, the transistor 17 on and a signal is inputted to the signal holding portion 18 in the writing period, as described in Embodiment 1. Specifically, the signal is inputted to the gate terminal of the transistor 91 and one of the terminals of the capacitor 92. Note that the signal is a binary signal (having a potential higher than the threshold voltage of the transistor 91 and a potential lower than the threshold voltage of the transistor 91). That is, which one of the two values the signal is determines the state (on or off state) of the transistor 91.

An operation in the reading period in which a signal is read from the selected one memory element 15 among the plurality of memory elements 15 illustrated in FIG. 9 is next explained below First, the output terminal is kept from being grounded through the plurality of memory elements 15 except the one selected memory element 15. This is performed in such a manner that the transistors 91 are off in all the memory elements 15 except the selected one among the plurality of memory elements 15 arranged in the column direction. Specifically, a low potential is inputted from the reading word line 93 to the other of the terminals of each of the capacitors 92 included in the plurality of memory elements 15. Consequently, the potentials of one of the terminals of the capacitor 92 and the gate terminal of the transistor 91 are decreased by the capacitive coupling. Here, these potentials are set to lower than the threshold voltage of the transistors 91, whereby the transistors 91 included in all the memory elements 15 arranged in the same column as the selected memory element 15 can be off. At this time, by forming a divider circuit having the transistor 91 as a resistor which is included in one selected memory element 15, a signal held in the memory element 15 can be identified. Specifically, the potential of a signal outputted from the divider circuit is low when the transistor 91 on, or is high when the transistor 91 off. By the identification of the outputted signal, the signal held in one selected memory element 15 can be identified.

All or part of this embodiment can be combined with all or part of another embodiment as appropriate.

Embodiment 6

In this embodiment, an example of the transistors included in the semiconductor devices described in Embodiments 1 to 5 is described. Specifically, an example of a semiconductor device having a transistor formed using a substrate including a semiconductor material and a transistor formed using an oxide semiconductor is described.

Structural Example

Figure 10:
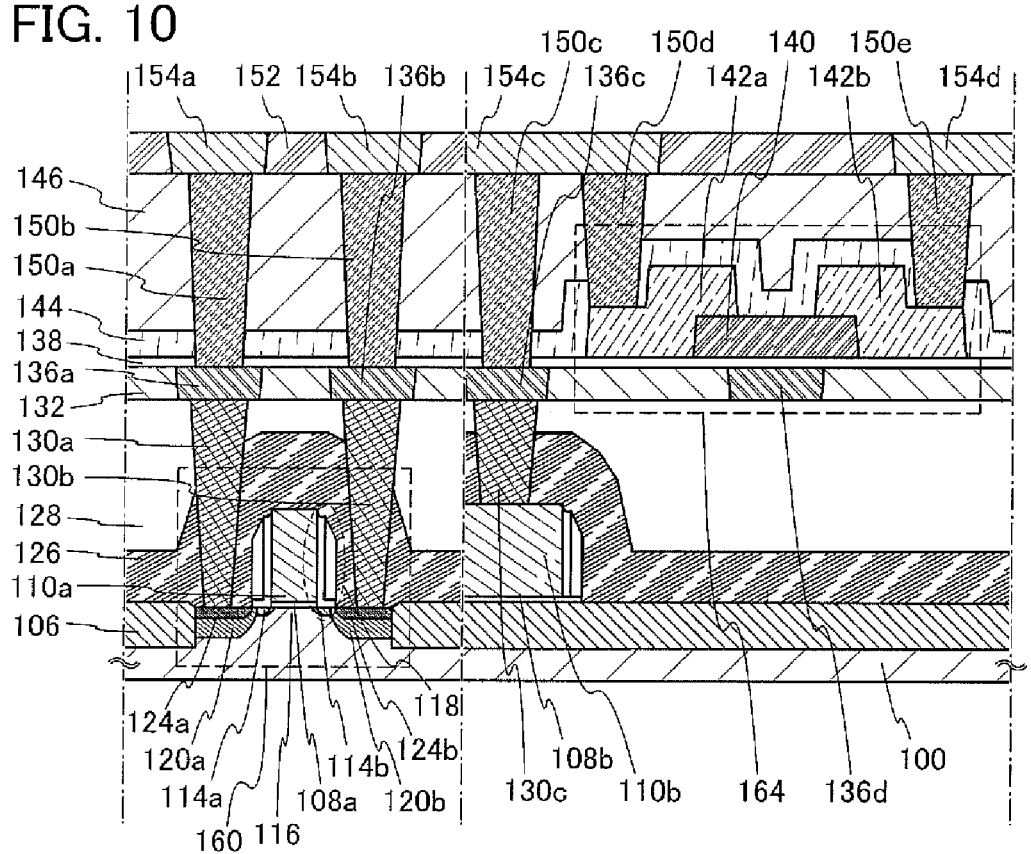
FIG. 10 illustrates a semiconductor device according to Embodiment 6.

FIG. 10 is a cross-sectional view of a semiconductor device of this embodiment.

A transistor 160 illustrated in FIG. 10 includes a channel formation region 116 provided over a substrate 100 including a semiconductor material, a pair of impurity regions 114a and 114b and a pair of high concentration impurity regions 120a and 120b (these regions are also collectively referred to simply as impurity regions) which are provided so that the channel formation region 116 is interposed therebetween, a gate insulating layer 108a provided over the channel formation region 116, a gate electrode layer 110a provided over the gate insulating layer 108a, a source electrode layer 130a which is electrically connected to the impurity region 114a, and a drain electrode layer 130b which is electrically connected to the impurity region 114b.

Note that sidewall insulating layers 118 are provided on side surfaces of the gate electrode layer 110a. The substrate 100 including a semiconductor material is provided with the pair of high concentration impurity regions 120a and 120b in regions which do not overlap with the sidewall insulating layers 118. The substrate 100 is also provided with a pair of metal compound regions 124a and 124b over the pair of high concentration impurity regions 120a and 120b. Further, element isolation insulating layers 106 are provided over the substrate 100 so that the transistor 160 can be interposed therebetween, and an interlayer insulating layer 126 and an interlayer insulating layer 128 are provided so as to cover the transistor 160. The source electrode layer 130a and the drain electrode layer 130b are electrically connected to the metal compound region 124a and the metal compound region 124b, respectively, through openings formed in the interlayer insulating layer 126 and the interlayer insulating layer 128. In other words, the source electrode layer 130a is electrically connected to the high concentration impurity region 120a and the impurity region 114a through the metal compound region 124a, and the drain electrode layer 130b is electrically connected to the high concentration impurity region 120b and the impurity region 114b through the metal compound region 124b.

In addition, as layers below a transistor 164 described later, there are an insulating layer 108b including the same material as the gate insulating layer 108a, an electrode layer 110b including the same material as the gate electrode layer 110a, and an electrode layer 130c including the same material as the source electrode layer 130a and the drain electrode layer 130b.

The transistor 164 illustrated in FIG. 10 includes a gate electrode layer 136d provided over the interlayer insulating layer 128, a gate insulating layer 138 provided over the gate electrode layer 136d, an oxide semiconductor layer 140 provided over the gate insulating layer 138, and a source electrode layer 142a and a drain electrode layer 142b which are provided over the oxide semiconductor layer 140 and electrically connected to the oxide semiconductor layer 140.

Here, the gate electrode layer 136d is provided so as to be embedded in an insulating layer 132 formed over the interlayer insulating layer 128. Like the gate electrode layer 136d, an electrode layer 136a and an electrode layer 136b are formed, which are respectively in contact with the source electrode layer 130a and the drain electrode layer 130b included in the transistor 160. In addition, an electrode layer 136c in contact with the electrode layer 130c is formed.

Over the transistor 164, a protective insulating layer 144 is provided to be partly in contact with the oxide semiconductor layer 140, and an interlayer insulating layer 146 is provided over the protective insulating layer 144. Here, openings reaching the source electrode layer 142a and the drain electrode layer 142b are provided in the protective insulating layer 144 and the interlayer insulating layer 146. An electrode layer 150d and an electrode layer 150e are formed, which are respectively in contact with the source electrode layer 142a and the drain electrode layer 142b through the openings. Like the electrode layers 150d and 150e, an electrode layer 150a, an electrode layer 150b, and an electrode layer 150c are formed, which are respectively in contact with the electrode layer 136a, the electrode layer 136b, and the electrode layer 136c through openings provided in the gate insulating layer 138, the protective insulating layer 144, and the interlayer insulating layer 146.

The oxide semiconductor layer 140 is highly purified by sufficiently removing an impurity such as hydrogen therein. Specifically, the hydrogen concentration of the oxide semiconductor layer 140 is $5\times10^{19}$ (atoms/cm$^3$) or less. Note that the preferable hydrogen concentration of the oxide semiconductor layer 140 is $5\times10^{18}$ (atoms/cm$^3$) or less, far preferably $5\times10^{17}$ (atoms/cm$^3$) or less. By use of the highly purified oxide semiconductor layer 140 with a sufficiently reduced hydrogen concentration, the transistor 164 having an excellent off-current characteristic can be obtained. For example, in the case where the drain voltage Vd is +1 V or +10 V, the leakage current is $1\times10^{-13}$ [A] or less. Applying the highly purified oxide semiconductor layer 140 with a sufficiently reduced hydrogen concentration allows a reduction in the leakage current of the transistor 164. Note that the concentration of hydrogen in the oxide semiconductor layer 140 is measured by secondary ion mass spectrometry (SIMS).

Over the interlayer insulating layer 146, an insulating layer 152 is provided, and an electrode layer 154a, an electrode layer 154b, an electrode layer 154c, and an electrode layer 154d are provided so as to be embedded in the insulating layer 152. The electrode layer 154a is in contact with the electrode layer 150a; the electrode layer 154b is in contact with the electrode layer 150b; the electrode layer 154c is in contact with the electrode layer 150c and the electrode layer 150d; and the electrode layer 154d is in contact with the electrode layer 150e.

The source electrode layer 130a in the transistor 160 of this embodiment is electrically connected to the electrode layers 136a, 150a, and 154a which are provided in the upper region. Thus, conductive layers for the above-described electrode layers are formed as appropriate, whereby the source electrode layer 130a in the transistor 160 can be electrically connected to any of electrode layers included in the transistor 164 provided in the upper region. The drain electrode layer 130b in the transistor 160 can also be electrically connected to any of the electrode layers included in the transistor 164 provided in the upper region. Although not illustrated in FIG. 10, the gate electrode layer 110a in the transistor 160 can be electrically connected to any of the electrode layers included in the transistor 164 through an electrode layer provided in the upper region.

Similarly, the source electrode layer 142a in the transistor 164 described in this embodiment is electrically connected to the electrode layers 130c and 110b provided in the lower region. Thus, conductive layers for the above-described electrode layers are formed as appropriate, whereby the source electrode layer 142a in the transistor 164 can be electrically connected to any of the gate electrode layer 110a, the source electrode layer 130a, and the drain electrode layer 130b which are included in the transistor 160 provided in the lower region. Although not illustrated in FIG. 10, the gate electrode layer 136d or the drain electrode layer 142b in the transistor 164 can be electrically connected to any of the electrode layers included in the transistor 160 through an electrode layer provided in the lower region.

The above-described transistors 160 and 164 are provided as appropriate, and thus transistors included in any of the semiconductor devices described in Embodiments 1 to 5 can be formed. The transistor 164 including an oxide semiconductor is preferably applied to the transistor 17 included in any of the semiconductor devices described in Embodiments 1 to 5 (see FIGS. 1A to 1C) and to the transistor 21 included in any of the semiconductor devices described in Embodiments 2 and 3 (see FIG. 2). The leakage current of the transistor 164 is lower than that of the transistor 160. Accordingly, by applying the transistor 164 to the transistors 17 and 21, a signal can be accurately held in the memory element 15 for an extended period.

Example of Fabrication Steps

Next, examples of methods of fabricating the transistor 160 and the transistor 164 are described. Hereinafter, a method of fabricating the transistor 160 is described first with reference to FIGS. 11A to 11H, and a method of fabricating the transistor 164 is then described with reference to FIGS. 12A to 12G and FIGS. 13A to 13D.

Figure 11A:
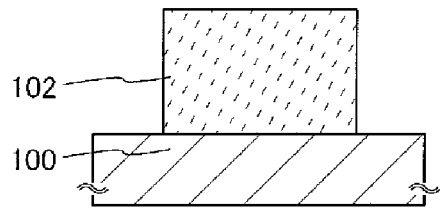
FIGS. 11A to 11H illustrate a semiconductor device according to Embodiment 6.

First, the substrate 100 including a semiconductor material is prepared (see FIG. 11A). As the substrate 100 including a semiconductor material, it is possible to apply a single crystal semiconductor substrate containing silicon, silicon carbide, or the like, a polycrystalline semiconductor substrate, a compound semiconductor substrate containing silicon germanium or the like, or an SOI substrate, for example. Here, an example of the case where a single crystal silicon substrate is used as the substrate 100 including a semiconductor material is described. Note that in general, the "SOI substrate" means a semiconductor substrate in which a silicon semiconductor layer is provided on an insulating surface. In this specification and the like, the "SOI substrate" also includes a semiconductor substrate in which a semiconductor layer containing a material other than silicon is provided over an insulating surface in its category. That is, a semiconductor layer included in the "SOI substrate" is not limited to a silicon semiconductor layer. Further, the "SOI substrate" includes a structure in which a semiconductor layer is provided over an insulating substrate such as a glass substrate with an insulating layer interposed therebetween.

Over the substrate 100, a protective layer 102 serving as a mask for formation of the element isolation insulating layer is formed (see FIG. 11A). As the protective layer 102, for example, an insulating layer containing a material such as silicon oxide, silicon nitride, or silicon nitride oxide can be used. Note that before or after this step, an impurity element imparting n-type conductivity or an impurity element imparting p-type conductivity may be added to the substrate 100 in order to control the threshold voltage of the semiconductor device. In the case where the semiconductor is silicon, phosphorus, arsenic, or the like can be used as the impurity imparting n-type conductivity. As the impurity imparting p-type conductivity, boron, aluminum, gallium, or the like can be used.

Next, part of the substrate 100 in a region which is not covered with the protective layer 102 (exposed region) is etched with use of the protective layer 102 as a mask. By this etching, an isolated semiconductor region 104 is formed (see FIG. 11B). As the etching, dry etching is preferably employed, but wet etching may be employed. An etching gas and an etchant can be selected as appropriate depending on a material of layers to be etched.

Figure 11B:
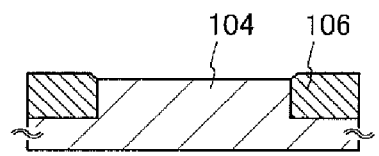

Next, an insulating layer is formed to cover the semiconductor region 104, and the insulating layer in a region overlapping with the semiconductor region 104 is selectively removed, so that the element isolation insulating layers 106 are formed (see FIG. 11B). The insulating layer is formed using silicon oxide, silicon nitride, silicon nitride oxide, or the like. As a method of removing the insulating layer, polishing treatment such as CMP (chemical mechanical polishing), etching treatment, or the like can be given, and any of the above treatment may be used. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

The insulating layer serves later as a gate insulating layer, and is a single-layer structure of a film containing silicon oxide, silicon nitride oxide, silicon nitride, hafnium oxide, aluminum oxide, tantalum oxide, or the like or a stacked-layer structure thereof which is formed by a CVD method, a sputtering method, or the like. Alternatively, the surface of the semiconductor region 104 may be oxidized or nitrided by high-density plasma treatment or thermal oxidation treatment so that the insulating layer is formed. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer, but the thickness can be set to from greater than or equal to 1 nm and less than or equal to 100 nm, for example.

The layer including a conductive material can be formed using a metal material such as aluminum, copper, titanium, tantalum, or tungsten. The layer including a conductive material may also be formed using a semiconductor material such as polycrystalline silicon including a conductive material. There is also no particular limitation on the method of forming the layer including a conductive material, and a variety of film formation methods, such as an evaporation method, a CVD method, a sputtering method, or a spin coating method can be employed. Note that in this embodiment, the case where the layer including a conductive material is formed using a metal material is described.

Figure 11C:
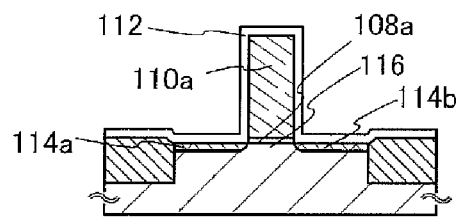

Then, the insulating layer and the layer including a conductive material are selectively etched, so that the gate insulating layer 108a and the gate electrode layer 110a are formed (see FIG. 11C).

Next, an insulating layer 112 covering the gate electrode layer 110a is formed (see FIG. 11C). Then, boron (B), phosphorus (P), arsenic (As), or the like is added to the semiconductor region 104, so that the pair of impurity regions 114a and 114b with a shallow junction are formed (see FIG. 11C). Note that by the formation of the pair of impurity regions 114a and 114b, the channel formation region 116 is formed in a portion of the semiconductor region 104 under the gate insulating layer 108a (see FIG. 11C). Here, the concentration of the added impurity can be set as appropriate, but the concentration is preferably increased when the size of a semiconductor element is highly miniaturized. Although the pair of impurity regions 114a and 114b are formed after formation of the insulating layer 112 here, the insulating layer 112 may be formed after formation of the pair of impurity regions 114a and 114b.

Figure 11D:
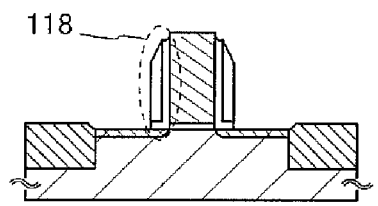
Figure 11E:
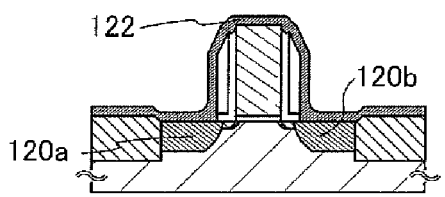
Figure 11F:
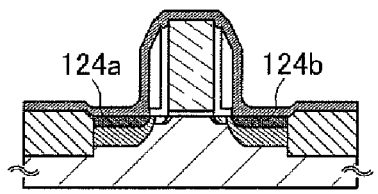

Next, the sidewall insulating layers 118 are formed (see FIG. 11D). An insulating layer is formed so as to cover the insulating layer 112, and highly anisotropic etching treatment is performed on the insulating layer, whereby the sidewall insulating layers 118 can be formed in a self-alignment manner. At this time, by partly etching the insulating layer 112, a top surface of the gate electrode layer 110a and top surfaces of the impurity regions 114a and 114b are preferably exposed.

Next, an insulating layer is formed to cover the gate electrode layer 110a, the pair of impurity regions 114a and 114b, the sidewall insulating layers 118, and the like. Then, boron (B), phosphorus (P), arsenic (As), or the like is added to part of the impurity regions 114a and 114b, so that the pair of high concentration impurity regions 120a and 120b are formed (see FIG. 11E). After that, the insulating layer is removed, and a metal layer 122 is formed to cover the gate electrode layer 110a, the sidewall insulating layers 118, the pair of high concentration impurity regions 120a and 120b, and the like (see FIG. 11E). The metal layer 122 can be formed by a variety of film formation methods, such as a vacuum evaporation method, a sputtering method, or a spin coating method. It is preferable that the metal layer 122 be formed using a metal material that reacts with a semiconductor material included in the semiconductor region 104 to form a metal compound having low resistance. Examples of such metal materials include titanium, tantalum, tungsten, nickel, cobalt, platinum, and the like.

Next, heat treatment is performed, so that the metal layer 122 reacts with the semiconductor material. Consequently, the pair of metal compound regions 124a and 124b are formed, which are in contact with the pair of high concentration impurity regions 120a and 120b (see FIG. 11F). In the case where polycrystalline silicon or the like is used for the gate electrode layer 110a, a portion of the gate electrode layer 110a which is in contact with the metal layer 122 also becomes a metal compound region.

As the heat treatment, irradiation with a flash lamp can be employed. Although it is needless to say that other heat treatment methods may be used, a method by which heat treatment for an extremely short time can be achieved is preferably employed in order to improve the controllability of chemical reaction in formation of the metal compound. Note that each metal compound region is formed by reaction of the metal material and the semiconductor material, and is a region having sufficiently increased conductivity. The formation of the metal compound regions can sufficiently reduce electric resistance and improve element characteristics. Note that the metal layer 122 is removed after the pair of metal compound regions 124a and 124b are formed.

Figure 11G:
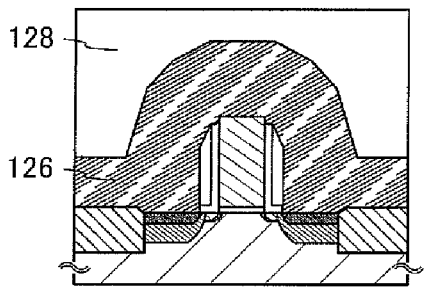

Next, the interlayer insulating layer 126 and the interlayer insulating layer 128 are formed so as to cover the components formed in the above steps (see FIG. 11G). The interlayer insulating layers 126 and 128 can be formed using a material including an inorganic insulating material, such as silicon oxide, silicon nitride oxide, silicon nitride, hafnium oxide, aluminum oxide, or tantalum oxide. An organic insulating material such as polyimide or acrylic can also be used. Note that a two-layer structure having the interlayer insulating layers 126 and 128 is employed here; however, the structure of an interlayer insulating layer is not limited to this structure. After the formation of the interlayer insulating layer 128, a surface thereof is preferably planarized with CMP, etching, or the like.

Figure 11H:
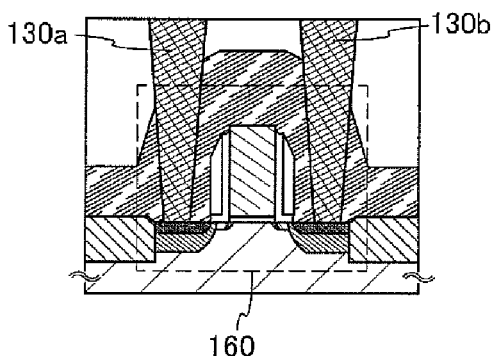

Then, openings that reach the pair of metal compound regions 124a and 124b are formed in the interlayer insulating layers, and the source electrode layer 130a and the drain electrode layer 130b are formed in the openings (see FIG. 11H). The source electrode layer 130a and the drain electrode layer 130b can be formed in such a manner, for example, that a conductive layer is formed in a region including the openings by a PVD method, a CVD method, or the like and then part of the conductive layer is removed by a method such as etching or CMP.

It is preferable that the source electrode layer 130a and the drain electrode layer 130b be formed to have a planar surface. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. When the surface including the source electrode layer 130a and the drain electrode layer 130b is planarized in such a manlier, an electrode, a wiring, an insulating layer, a semiconductor layer, and the like can be favorably formed in later steps.

Note that only the source electrode layer 130a and the drain electrode layer 130b in contact with the metal compound regions 124a and 124b are illustrated here; however, an electrode layer serving as a wiring (e.g., the electrode layer 130c in FIG. 10) and the like can also be formed in this step. There is no particular limitation on a material that can be used for the source electrode layer 130a and the drain electrode layer 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 including a semiconductor material is formed. Note that an electrode, a wiring, an insulating layer, or the like may be further formed after the above steps. When the wirings have a multi-layer structure of a stack including an interlayer insulating layer and a conductive layer, a highly integrated circuit can be provided.

Next, steps for manufacturing the transistor 164 over the interlayer insulating layer 128 are described with reference to FIGS. 12A to 12G and FIGS. 13A to 13D. Note that FIGS. 12A to 12G and FIGS. 13A to 13D illustrate steps for manufacturing various electrode layers, the transistor 164, and the like over the interlayer insulating layer 128, and a description of the transistor 160 and the like placed below the transistor 164 is omitted.

Figure 12A:
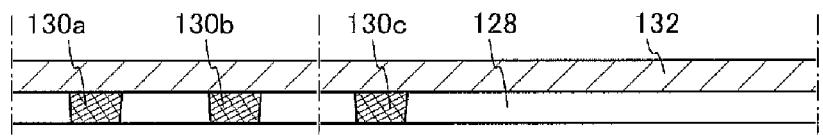
FIGS. 12A to 12G illustrate a semiconductor device according to Embodiment 6.
Figure 12B:

First, the insulating layer 132 is formed over the interlayer insulating layer 128, the source electrode layer 130a, the drain electrode layer 130b, and the electrode layer 130c (see FIG. 12A). The insulating layer 132 can be formed by a PVD method, a CVD method, or the like. The insulating layer 132 can also be formed using a material including an inorganic insulating material such as silicon oxide, silicon nitride oxide, silicon nitride, hafnium oxide, aluminum oxide, or tantalum oxide.

Next, openings that reach the source electrode layer 130a, the drain electrode layer 130b, and the electrode layer 130c are formed in the insulating layer 132. At this time, an opening is also formed in a region where the gate electrode layer 136d is to be formed later. Then, a conductive layer 134 is formed to be embedded in the openings (see FIG. 12B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. As a material that can be used for the formation of the conductive layer 134, molybdenum, titanium, chromium, tantalum, tungsten, aluminum, copper, neodymium, or scandium or an alloy or a compound (e.g., a nitride) of any of these materials can be given, for example.

Specifically, it is possible to employ a method, for example, in which a thin titanium film is formed in a region including the openings by a PVD method and a thin titanium nitride film is formed by a CVD method, and then, a tungsten film is formed to be embedded in the openings. Here, the titanium film formed by a PVD method has a function of deoxidizing an oxide film at an interface to decrease the contact resistance with lower electrode layers (here, the source electrode layer 130a, the drain electrode layer 130b, the electrode layer 130c, and the like). Further, the titanium nitride film formed after the formation of the titanium film has a barrier function of suppressing diffusion of the conductive material. A copper film may also be formed by a plating method after formation of a barrier film of titanium, titanium nitride, or the like.

Figure 12C:
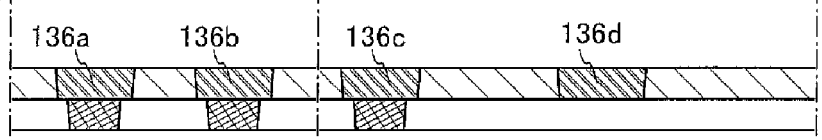

After the conductive layer 134 is formed, part of the conductive layer 134 is removed by a method such as etching or CMP, so that the insulating layer 132 is exposed and the electrode layer 136a, the electrode layer 136b, the electrode layer 136c, and the gate electrode layer 136d are formed (see FIG. 12C). Note that when the electrode layer 136a, the electrode layer 136b, the electrode layer 136c, and the gate electrode layer 136d are formed by removing part of the conductive layer 134, the process is preferably performed so that the surfaces are planarized. When the surfaces of the insulating layer 132, the electrode layer 136a, the electrode layer 136b, the electrode layer 136c, and the gate electrode layer 136d, are planarized in such a manner, an electrode, a wiring, an insulating layer, a semiconductor layer, and the like can be favorably formed in later steps.

Figure 12D:
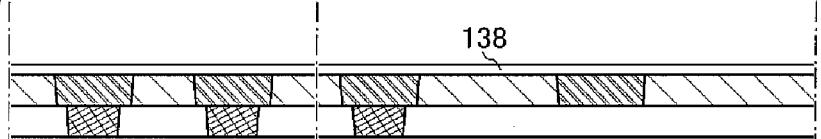

Next, the gate insulating layer 138 is formed to cover the insulating layer 132, the electrode layer 136a, the electrode layer 136b, the electrode layer 136c, and the gate electrode layer 136d (see FIG. 12D). The gate insulating layer 138 can be formed by a CVD method, a sputtering method, or the like. The gate insulating layer 138 is preferably formed to include silicon oxide, silicon nitride, silicon oxynitride, silicon nitride oxide, aluminum oxide, hafnium oxide, tantalum oxide, or the like. Note that the gate insulating layer 138 may have a single-layer structure or a stacked layer structure. For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138; the thickness can be set to 10 nm to 500 nm inclusive, for example. In the case of a stacked layer structure, for example, it is preferable to employ a stack of a first gate insulating layer with a thickness of 50 nm to 200 nm inclusive, and a second gate insulating layer with a thickness of 5 nm to 300 nm inclusive.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and favorable interface characteristics can be obtained.

It is needless to say that, even when a highly purified oxide semiconductor layer is used, another method such as a sputtering method or a plasma CVD method can be employed as long as a high-quality insulating layer can be formed as a gate insulating layer. Moreover, it is possible to use an insulating layer whose quality and interface characteristics are improved by heat treatment performed after the formation of the insulating layer. In any case, an insulating layer that has favorable film quality as the gate insulating layer 138 and can reduce interface state density of the interface with the oxide semiconductor layer to form a favorable interface is formed.

In a gate bias-temperature stress test (BT test) at 85° C. with $2 \times 10^6$ (V/cm) for 12 hours, if an impurity is added to an oxide semiconductor, a bond between the impurity and a main component of the oxide semiconductor is broken by a high electric field (B: bias) and high temperature (T: temperature), and a generated dangling bond induces a drift of the threshold voltage (Vth).

In contrast, when impurities in an oxide semiconductor, particularly hydrogen and water, are reduced to a minimum so that an interface with the gate insulating layer can have preferable characteristics as described above, a transistor that is stable through the BT test can be obtained.

Figure 12E:
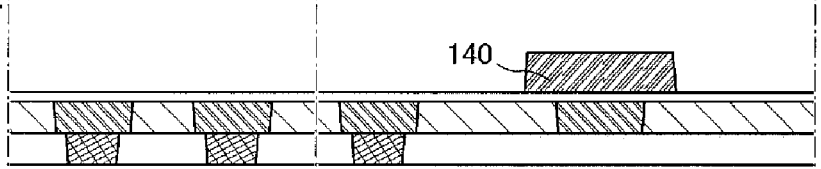

Next, an oxide semiconductor layer is formed over the gate insulating layer 138 and processed by a method such as etching using a mask, so that the island-shaped oxide semiconductor layer 140 is formed (see FIG. 12E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer, which is preferably amorphous in particular. In this embodiment, as the oxide semiconductor layer, an amorphous oxide semiconductor layer is formed by a sputtering method using an In—Ga—Zn—O-based oxide semiconductor target. Note that since crystallization of the layer can be suppressed by adding silicon to the amorphous oxide semiconductor layer, an oxide semiconductor layer may be formed, for example, the oxide semiconductor layer may be formed using a target containing $SiO_2$ at 2 wt % to 10 wt % inclusive.

As a target used for forming the oxide semiconductor layer by a sputtering method, a metal oxide target containing zinc oxide or the like as its main component can be used, for example. An oxide semiconductor target containing In, Ga, and Zn (as the composition ratio, the ratio of $In_2O_3$ to $Ga_2O_3$ and ZnO is 1:1:1 [molar ratio], or the ratio of In to Ga and Zn is 1:1:0.5 [atomic ratio]) can also be used, for example. As the oxide semiconductor target containing In, Ga, and Zn, a target in which the composition ratio of In to Ga and Zn is 1:1:1 [atomic ratio] or a target in which the composition ratio of In to Ga and Zn is 1:1:2 [atomic ratio] may also be used. The filling rate of the oxide semiconductor target is greater than or equal to 90% and less than or equal to 100%, preferably greater than or equal to 95% (e.g., 99.9%). A dense oxide semiconductor layer is formed by using an oxide semiconductor target with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a hydroxyl group, or hydride is removed to a concentration of about several parts per million (ppm) (preferably about several parts per billion (ppb)).

In forming the oxide semiconductor layer, the substrate is held in a treatment chamber that is maintained at reduced pressure and the substrate temperature is set to 100° C. to 600° C. inclusive, preferably 200° C. to 400° C. inclusive. The oxide semiconductor layer is formed while the substrate is heated, so that the concentration of the impurities in the oxide semiconductor layer can be reduced. In addition, damage by sputtering is reduced. Then, a sputtering gas from which hydrogen and water are removed is introduced into the treatment chamber while moisture remaining in the treatment chamber is being removed, and the oxide semiconductor layer is formed with metal oxide as a target. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, a hydrogen atom, a compound containing a hydrogen atom such as water ($H_2O$) (and preferably also a compound containing a carbon atom), and the like are removed, and accordingly, the concentration of the impurities in the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power is 0.5 kW; and the atmosphere is oxygen (the flow rate ratio of oxygen is 100%). Note that it is preferable to use a pulse direct current (DC) power supply because dust generated in deposition can be reduced and the thickness distribution is uniform. The thickness of the oxide semiconductor layer is 2 nm to 200 nm inclusive, preferably 5 nm to 30 nm inclusive. Note that an appropriate thickness differs depending on an oxide semiconductor material, and the thickness is set as appropriate depending on the material to be used.

Note that before the oxide semiconductor layer is formed by a sputtering method, dust adhering to a surface of the gate insulating layer 138 is preferably removed by reverse sputtering in which an argon gas is introduced and plasma is generated. Here, the reverse sputtering is a method in which ions collide with a surface to be processed so that the quality of the surface is changed, in contrast to normal sputtering in which ions collide with a sputtering target. An example of a method for making ions collide with a surface to be processed is a method in which a high-frequency voltage is applied to the surface in an argon atmosphere so that plasma is generated near a substrate. Note that an atmosphere of nitrogen, helium, oxygen, or the like may be used instead of an argon atmosphere.

As the etching of the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). A gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may also be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated by the first heat treatment. The temperature of the first heat treatment is greater than or equal to 300° C. and less than or equal to 750° C., preferably greater than or equal to 400° C. and less than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that reentry of water and hydrogen can be prevented.

The heat treatment apparatus is not limited to the electric furnace and may be an apparatus for heating an object by thermal conduction or thermal radiation from a medium such as a heated gas. For example, it is possible to use an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that is not reacted with an object to be processed by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. With use of the GRTA process, high-temperature heat treatment for a short time can be achieved. Moreover, the GRTA process can be employed even when the temperature exceeds the strain point of the substrate since it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e. the impurity concentration is 1 ppm or less, preferably 0.1 ppm or less).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, the oxide semiconductor layer sometimes becomes a layer in which a microcrystal (with a grain size of 1 nm to 20 nm inclusive, typically 2 nm to 4 nm inclusive) is mixed in an amorphous oxide semiconductor (e.g., a surface of the oxide semiconductor layer).

Electrical characteristics of the oxide semiconductor layer can be changed by aligning microcrystals in an amorphous structure. For example, when the oxide semiconductor layer is formed using an In—Ga—Zn—O-based oxide semiconductor target, electrical characteristics of the oxide semiconductor layer can be changed by formation of a microcrystalline portion in which crystal grains of $In_2Ga_2ZnO_7$ with electrical anisotropy are aligned.

More specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing penetration of an impurity such as water or hydrogen into the oxide semiconductor layer.

Note that the oxide semiconductor layer including the microcrystalline portion can be formed by heating the surface of the oxide semiconductor layer in a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described heat treatment can be referred to as dehydration treatment, dehydrogenation treatment, or the like because it is effective in dehydrating or dehydrogenating the oxide semiconductor layer 140. Such dehydration treatment or dehydrogenation treatment can be performed, for example, after forming the oxide semiconductor layer, after stacking source and drain electrode layers over the oxide semiconductor layer 140, or after forming a protective insulating layer over the source and drain electrode layers. Such dehydration treatment or dehydrogenation treatment may be conducted more than once.

Figure 12F:
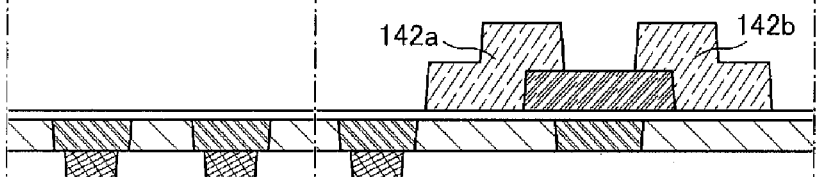

Next, the source electrode layer 142a and the drain electrode layer 142b are formed so as to be in contact with the oxide semiconductor layer 140 (see FIG. 12F). The source electrode layer 142a and the drain electrode layer 142b can be formed in such a manner that a conductive layer is formed to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. One or more materials selected from manganese, magnesium, zirconium, beryllium, and thorium may be used. It is also possible to use aluminum combined with one or more of elements selected from titanium, tantalum, tungsten, molybdenum, chromium, neodymium, and scandium. The conductive layer may have a single-layer structure or a stacked layer structure including two or more layers. For example, the conductive layer can have a single-layer structure of an aluminum film containing silicon, a two-layer structure in which a titanium film is stacked over an aluminum film, a three-layer structure in which a titanium film, an aluminum film, and a titanium film are stacked, or the like.

Here, ultraviolet light, KrF laser light, or ArF laser light is preferably used for light exposure in forming a mask used for etching.

The channel length (L) of the transistor is determined by a distance between a lower edge portion of the source electrode layer 142a and a lower edge portion of the drain electrode layer 142b. Note that in the case where the channel length (L) is less than 25 nm, light exposure for forming a mask is performed with extreme ultraviolet rays whose wavelength is extremely short of several nanometers to several hundreds of nanometers. In the light exposure with extreme ultraviolet light, the resolution is high and the focus depth is large. For these reasons, the channel length (L) of the transistor to be formed later can be in the range of 10 nm to 1000 nm inclusive, and the circuit can operate at higher speed.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source electrode layer 142a or between the oxide semiconductor layer 140 and the drain electrode layer 142b. The oxide conductive layer and a metal layer for forming the source electrode layer 142a and the drain electrode layer 142b can be successively formed (successive deposition). The oxide conductive layer can function as a source region or a drain region. The placement of such an oxide conductive layer can reduce the resistance of the source region or the drain region, so that the transistor can operate at high speed.

In order to reduce the number of the above masks to be used and reduce the number of steps, an etching step may be performed using a resist mask formed with a multi-tone mask which is a light-exposure mask that transmits light to make it have multiple intensities. A resist mask formed using a multi-tone mask has a shape with multiple thicknesses (has a stepped shape) and the shape further can be changed by ashing; therefore the resist mask can be used in multiple etching steps for processing for making different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. The plasma treatment removes water or the like that adheres to an exposed surface of the oxide semiconductor layer. In the plasma treatment, a mixed gas of oxygen and argon may be used.

Figure 12G:
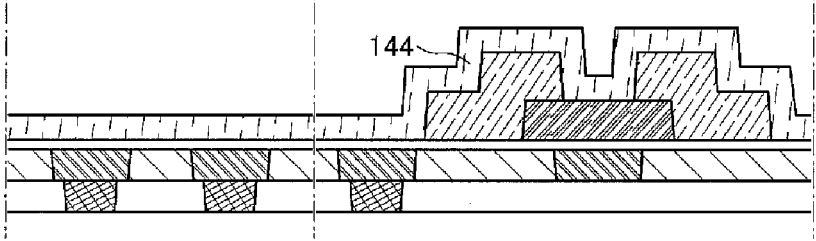

Next, the protective insulating layer 144 is formed in contact with part of the oxide semiconductor layer 140 without exposure to the air (see FIG. 12G).

The protective insulating layer 144 can be formed by a method such as a sputtering method, by which impurities such as water and hydrogen are prevented from being mixed to the protective insulating layer 144, as appropriate. The protective insulating layer 144 has a thickness of at least 1 nm or more. The protective insulating layer 144 can be formed using silicon oxide, silicon nitride, silicon oxynitride, silicon nitride oxide, or the like. The protective insulating layer 144 may have a single-layer structure or a stacked layer structure. The substrate temperature in forming the protective insulating layer 144 is preferably from room temperature to 300° C. inclusive. The atmosphere for forming the protective insulating layer 144 is preferably a rare gas (typically, argon) atmosphere, an oxygen atmosphere, or a mixed atmosphere containing a rare gas (typically, argon) and oxygen.

If hydrogen is contained in the protective insulating layer 144, the hydrogen may penetrate into the oxide semiconductor layer 140 or extract oxygen in the oxide semiconductor layer 140, for example, whereby the resistance of the oxide semiconductor layer 140 on the backchannel side might be decreased and a parasitic channel might be formed. Therefore, it is important not to use hydrogen in forming the protective insulating layer 144 so that the protective insulating layer 144 contains as little hydrogen as possible.

Moreover, the protective insulating layer 144 is preferably formed while moisture left in the treatment chamber is removed, in order that hydrogen, a hydroxyl group, or moisture is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example, and accordingly, the concentration of the impurities in the protective insulating layer 144 formed in the deposition chamber can be reduced.

As a sputtering gas used in forming the protective insulating layer 144, it is preferable to use a high-purity gas from which an impurity such as hydrogen, water, a hydroxyl group, or hydride is removed to a concentration of about several parts per million (ppm) (preferably about several parts per billion (ppb)).

Next, second heat treatment is preferably performed in an inert gas atmosphere or an oxygen gas atmosphere (at 200° C. to 400° C. inclusive, for example, at 250° C. to 350° C. inclusive). For example, the second heat treatment is performed at 250° C. for one hour in a nitrogen atmosphere. The second heat treatment can reduce variation in electric characteristics of transistors.

Heat treatment may be performed at 100° C. to 200° C. inclusive for 1 hour to 30 hours inclusive in the air. In this heat treatment, heating may be performed while a fixed heating temperature is maintained or while an increase from room temperature to a heating temperature ranging from 100° C. to 200° C. inclusive and a decrease from the heating temperature to room temperature are repeated more than once. This heat treatment may be performed under reduced pressure before the protective insulating layer is formed. The heat treatment time can be shortened under reduced pressure. This heat treatment may be performed instead of the second heat treatment or may be performed before or after the second heat treatment, for example.

Figure 13A:
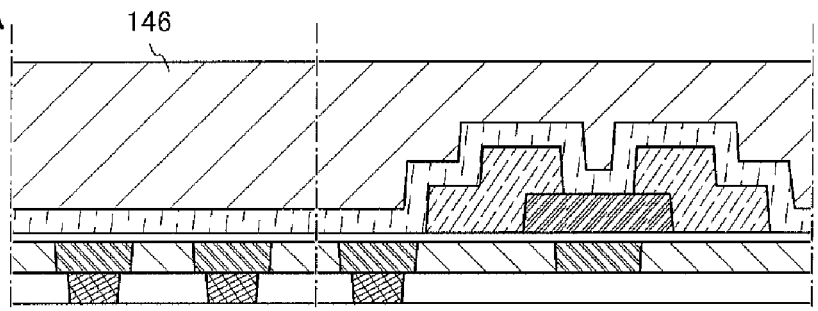
FIGS. 13A to 13D illustrate a semiconductor device according to Embodiment 6.
Figure 13B:
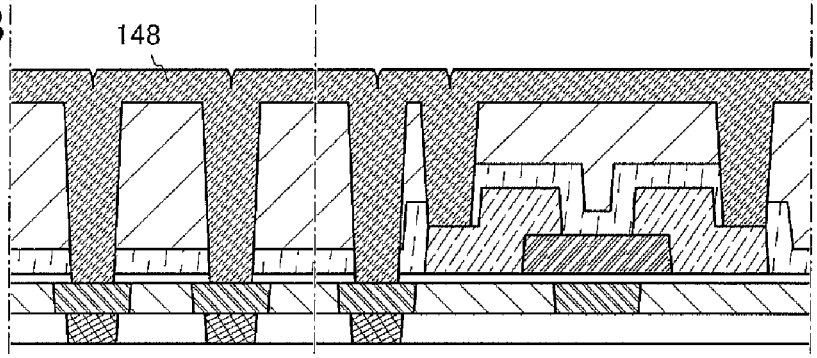

Next, the interlayer insulating layer 146 is formed over the protective insulating layer 144 (see FIG. 13A). The interlayer insulating layer 146 can be formed by a PVD method, a CVD method, or the like. The interlayer insulating layer 146 can be formed using a material including an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized by a method such as CMP, or etching.

Next, openings reaching the electrode layer 136a, the electrode layer 136b, the electrode layer 136c, the source electrode layer 142a, and the drain electrode layer 142b are formed in the interlayer insulating layer 146, the protective insulating layer 144, and the gate insulating layer 138. Then, a conductive layer 148 is formed to be embedded in the openings (see FIG. 13B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. As the material that can be used for the formation of the conductive layer 148, for example, a conductive material such as molybdenum, titanium, chromium, tantalum, tungsten, aluminum, copper, neodymium, or scandium, and an alloy or a compound (e.g., nitride) of any of these materials can be given.

Specifically, it is possible to employ a method, for example, in which a thin titanium film is formed in a region including the openings by a PVD method and a thin titanium nitride film is formed by a CVD method, and then, a tungsten film is formed to be embedded in the openings. Here, the titanium film formed by a PVD method has a function of deoxidizing an oxide film at an interface to decrease the contact resistance with lower electrodes (here, the electrode layer 136a, the electrode layer 136b, the electrode layer 136c, the source electrode layer 142a, and the drain electrode layer 142b). The titanium nitride film formed after the formation of the titanium film has a barrier function of suppressing diffusion of the conductive material. A copper film also may be formed by a plating method after formation of a barrier film of titanium, titanium nitride, or the like.

Figure 13C:
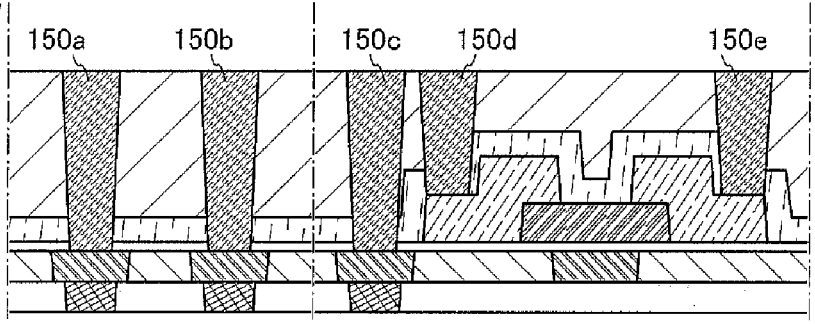
Figure 13D:
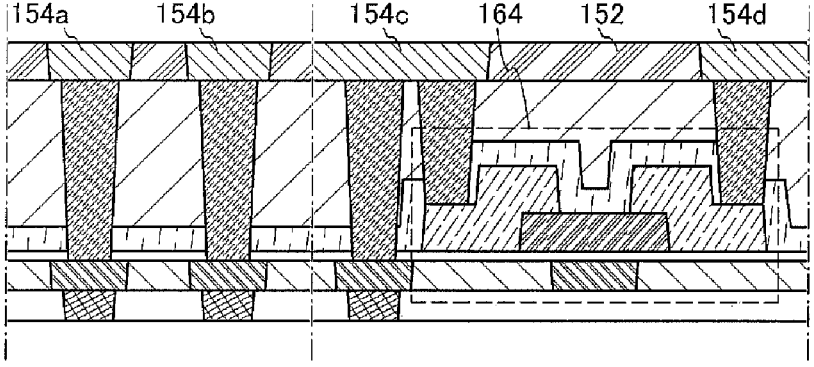

After the conductive layer 148 is formed, part of the conductive layer 148 is removed by a method such as etching or CMP, so that the interlayer insulating layer 146 is exposed and the electrode layer 150a, the electrode layer 150b, the electrode layer 150c, the electrode layer 150d, and the electrode layer 150e (see FIG. 13C). Note that when the electrode layer 150a, the electrode layer 150b, the electrode layer 150c, the electrode layer 150d, and the electrode layer 150e are formed by removing part of the conductive layer 148, the process is preferably performed so that the surfaces are planarized. When the surfaces of the interlayer insulating layer 146, the electrode layer 150a, the electrode layer 150b, the electrode layer 150c, the electrode layer 150d, and the electrode layer 150e are planarized in such a manner, an electrode, a wiring, an insulating layer, a semiconductor layer, and the like can be favorably formed in later steps.

Then, the insulating layer 152 is formed, and openings that reach the electrode layer 150a, the electrode layer 150b, the electrode layer 150c, the electrode layer 150d, and the electrode layer 150e are formed in the insulating layer 152. After a conductive layer is formed to be embedded in the openings, part of the conductive layer is removed by a method such as etching or CMP. Thus, the insulating layer 152 is exposed and the electrode layer 154a, the electrode layer 154b, the electrode layer 154c, and the electrode layer 154d (see FIG. 13D). This step is the same as step for forming the electrode layer 150a and the like and therefore not detailed.

In the case where the transistor 164 is formed by the above-described method, the hydrogen concentration of the oxide semiconductor layer 140 is $5 \times 10^{19}$ (atoms/cm$^3$) or less and the off-current of the transistor 164 is $1 \times 10^{-13}$ [A] or less.

Modification Example

FIG. 14, FIGS. 15A and 15B, FIGS. 16A and 16B, and FIGS. 17A and 17B illustrate modification examples of structures of the transistor 164. That is, the structure of the transistor 160 is the same as the above.

Figure 14:
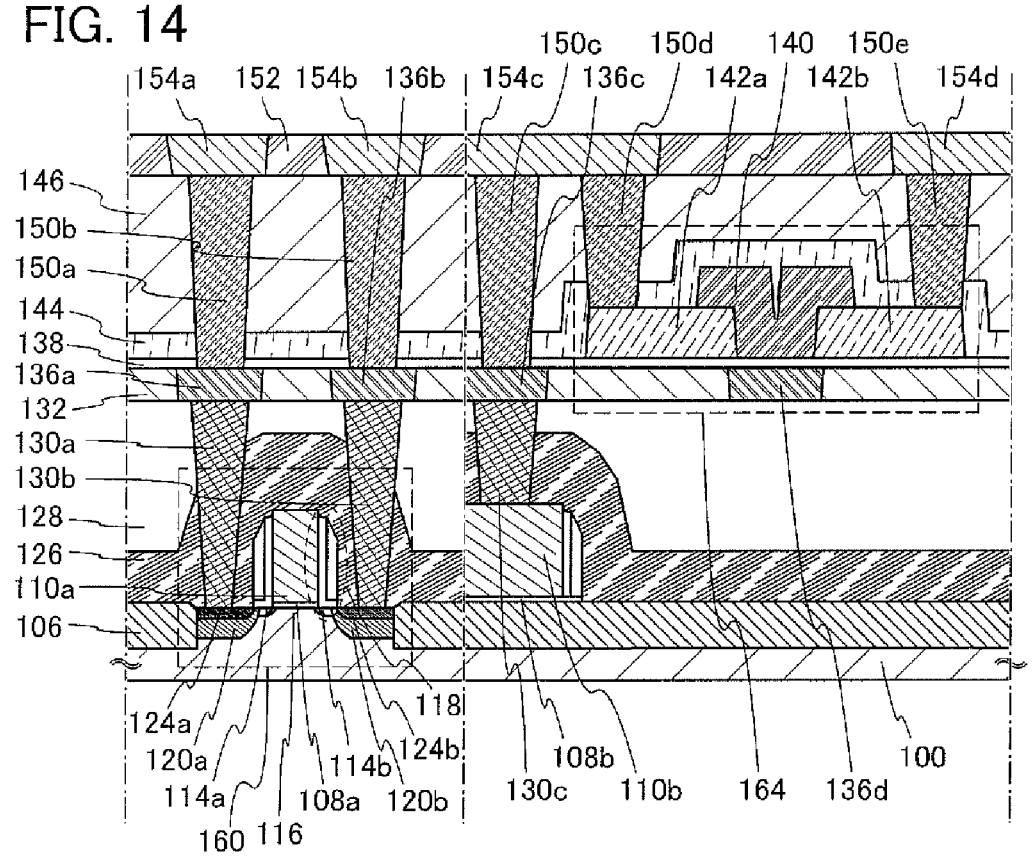
FIG. 14 illustrates a semiconductor device according to Embodiment 6.

FIG. 14 illustrates an example of the transistor 164 having a structure in which the gate electrode layer 136d is placed under the oxide semiconductor layer 140 and an end face of the source electrode layer 142a and an end face of the drain electrode layer 142b which are face each other are in contact with the oxide semiconductor layer 140.

A large difference in structure between FIG. 10 and FIG. 14 is the position at which the oxide semiconductor layer 140 is connected to the source and drain electrode layers 142a and 142b. That is, an upper surface of the oxide semiconductor layer 140 is in contact with the source and drain electrode layers 142a and 142b in the structure in FIG. 10, whereas the lower surface of the oxide semiconductor layer 140 is in contact with the source and drain electrode layers 142a and 142b in the structure in FIG. 14. Moreover, this difference in the contact position results in a difference in arrangement of other electrode layers, an insulating layer, and the like. Note that the details of each component are the same as those of FIG. 10.

Specifically, the transistor 164 illustrated in FIG. 14 includes the gate electrode layer 136d provided over the interlayer insulating layer 128, the gate insulating layer 138 provided over the gate electrode layer 136d, the source and drain electrode layers 142a and 142b provided over the gate insulating layer 138, and the oxide semiconductor layer 140 in contact with upper surfaces of the source and drain electrode layers 142a and 142b. In addition, over the transistor 164, the protective insulating layer 144 is provided so as to cover the oxide semiconductor layer 140.

Figure 15A:
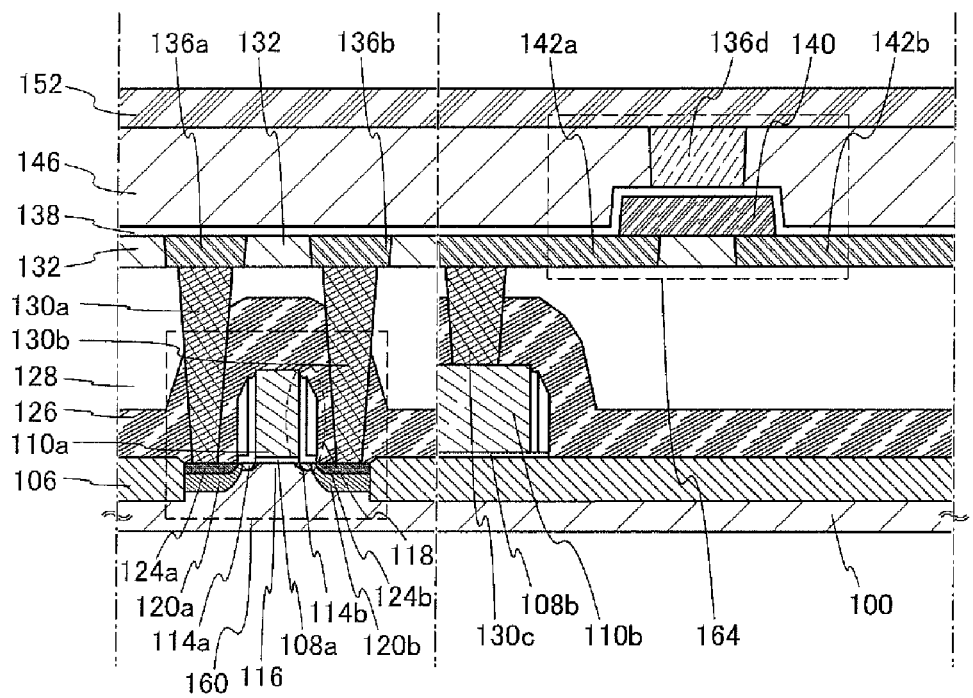
FIGS. 15A and 15B illustrate a semiconductor device according to Embodiment 6.
Figure 15B:
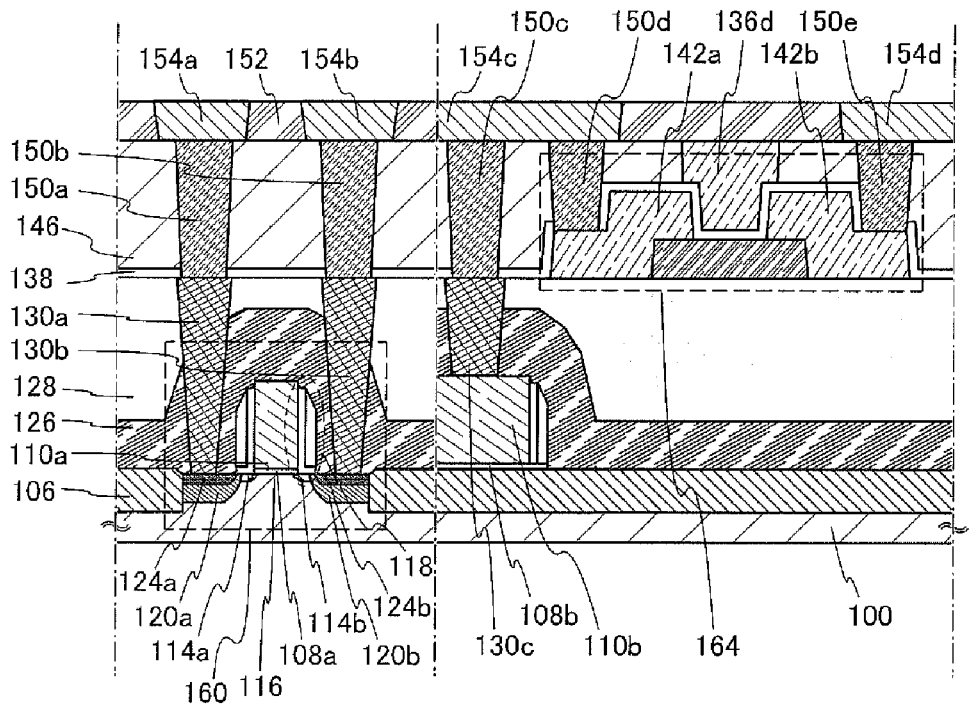

FIGS. 15A and 15B each illustrate the transistor 164 in which the gate electrode layer 136d is provided over the oxide semiconductor layer 140. FIG. 15A illustrates an example of a structure in which the source and drain electrode layers 142a and 142b are in contact with a lower surface of the oxide semiconductor layer 140. FIG. 15B illustrates an example of a structure in which the source and drain electrode layers 142a and 142b are in contact with an upper surface of the oxide semiconductor layer 140.

A large difference of the structures in FIGS. 15A and 15B from those in FIG. 10 and FIG. 14 is that the gate electrode layer 136d is placed over the oxide semiconductor layer 140. Furthermore, a large difference in structure between FIG. 15A and FIG. 15B is whether the source and drain electrode layers 142a and 142b are in contact with the lower surface or the upper surface of the oxide semiconductor layer 140. Moreover, these differences result in a difference in arrangement of other electrode layers, an insulating layer, and the like. The details of each component are the same as those of FIG. 10 and the like.

Specifically, the transistor 164 illustrated in FIG. 15A includes the source and drain electrode layers 142a and 142b provided over the interlayer insulating layer 128, the oxide semiconductor layer 140 in contact with the upper surfaces of the source and drain electrode layers 142a and 142b, the gate insulating layer 138 provided over the oxide semiconductor layer 140, and the gate electrode layer 136d over the gate insulating layer 138 in a region overlapping with the oxide semiconductor layer 140.

The transistor 164 illustrated in FIG. 15B includes the oxide semiconductor layer 140 provided over the interlayer insulating layer 128, the source and drain electrode layers 142a and 142b provided to be in contact with the upper surface of the oxide semiconductor layer 140, the gate insulating layer 138 provided over the oxide semiconductor layer 140 and the source and drain electrode layers 142a and 142b, and the gate electrode layer 136d provided over the gate insulating layer 138 and in a region overlapping with the oxide semiconductor layer 140.

Note that in the structures in FIGS. 15A and 15B, a component (e.g., the electrode layer 150a or the electrode layer 154a) is sometimes omitted from the structure in FIG. 10 or the like. In this case, a secondary effect such as simplification of a manufacturing process can be obtained. It is needless to say that a nonessential component can be omitted in the structures also in FIG. 10 and the like.

Figure 16A:
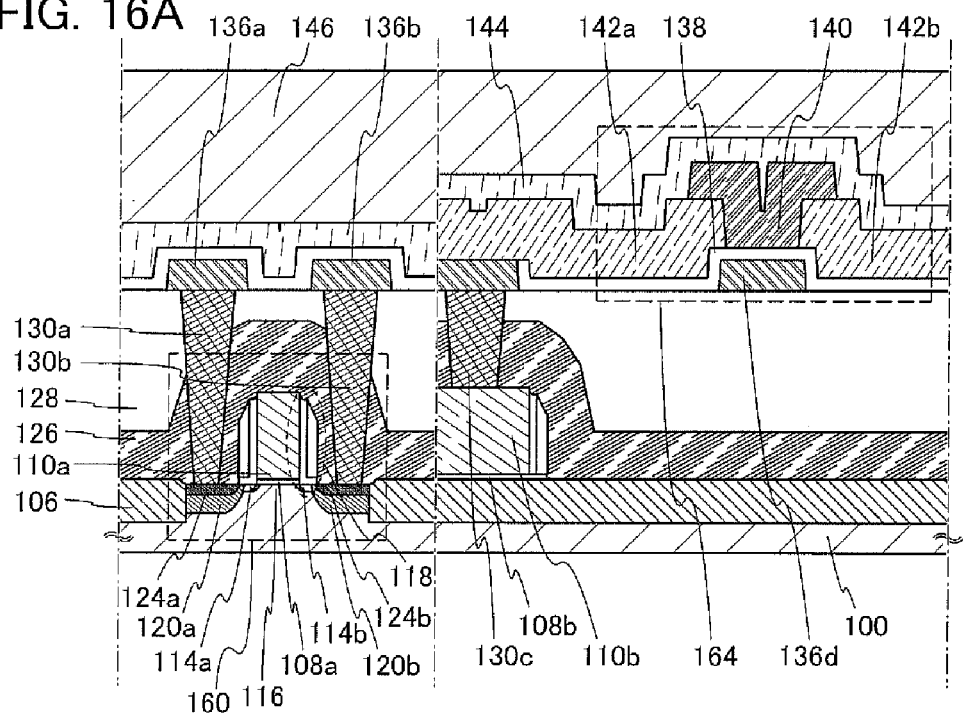
FIGS. 16A and 16B illustrate a semiconductor device according to Embodiment 6.
Figure 16B:
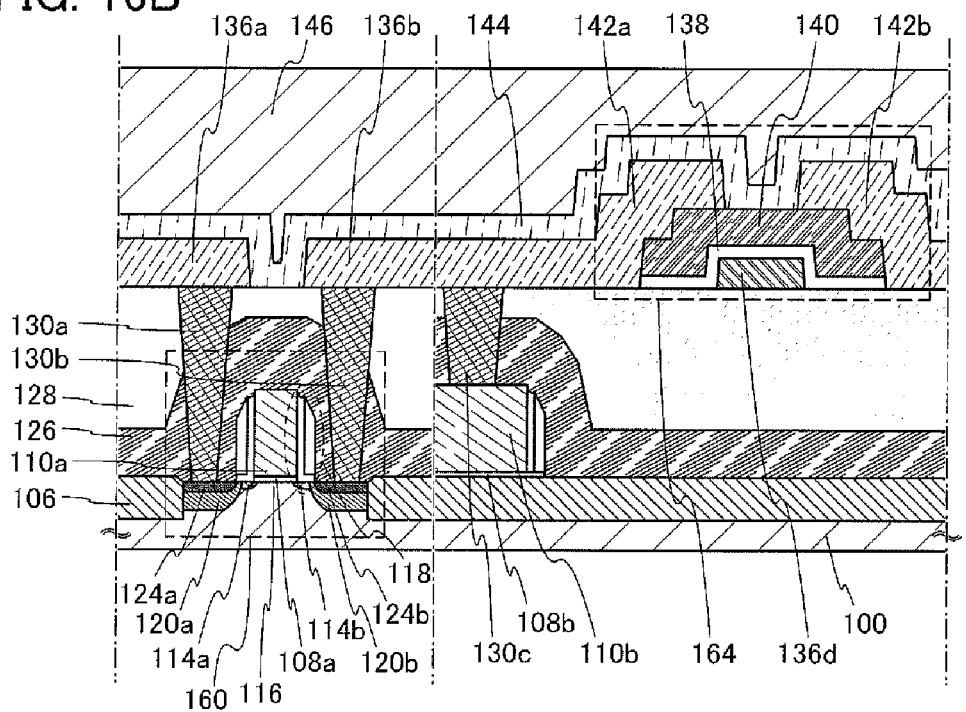

FIGS. 16A and 16B each illustrate the transistor 164 in the case where the size of the element is relatively large and the gate electrode layer 136d is placed under the oxide semiconductor layer 140. In this case, a demand for the planarity of a surface and the coverage is relatively moderate, so that a wiring, an electrode, and the like are not necessarily embedded in an insulating layer. For example, the gate electrode layer 136d and the like can be formed by patterning after formation of a conductive layer.

A large difference in structure between FIG. 16A and FIG. 16B is whether the source and drain electrode layers 142a and 142b are in contact with the lower surface or the upper surface of the oxide semiconductor layer 140. Moreover, these differences result in a difference in arrangement of other electrode layers, an insulating layer, and the like. Note that the details of each component are the same as those of FIG. 7 and the like.

Specifically, the transistor 164 illustrated in FIG. 16A includes the gate electrode layer 136d provided over the interlayer insulating layer 128, the gate insulating layer 138 provided over the gate electrode layer 136d, the source and drain electrode layers 142a and 142b provided over the gate insulating layer 138, and the oxide semiconductor layer 140 in contact with the upper surfaces of the source and drain electrode layers 142a and 142b.

Further, the transistor 164 illustrated in FIG. 16B includes the gate electrode layer 136d provided over the interlayer insulating layer 128, the gate insulating layer 138 provided over the gate electrode layer 136d, the oxide semiconductor layer 140 provided over the gate insulating layer 138 so as to overlap with the gate electrode layer 136d, and the source and drain electrode layers 142a and 142b provided to be in contact with the upper surface of the oxide semiconductor layer 140.

Note that also in the structures in FIGS. 16A and 16B, a component is sometimes omitted from the structure in FIG. 10 or the like. Also in this case, a secondary effect such as simplification of a manufacturing process can be obtained.

Figure 17A:
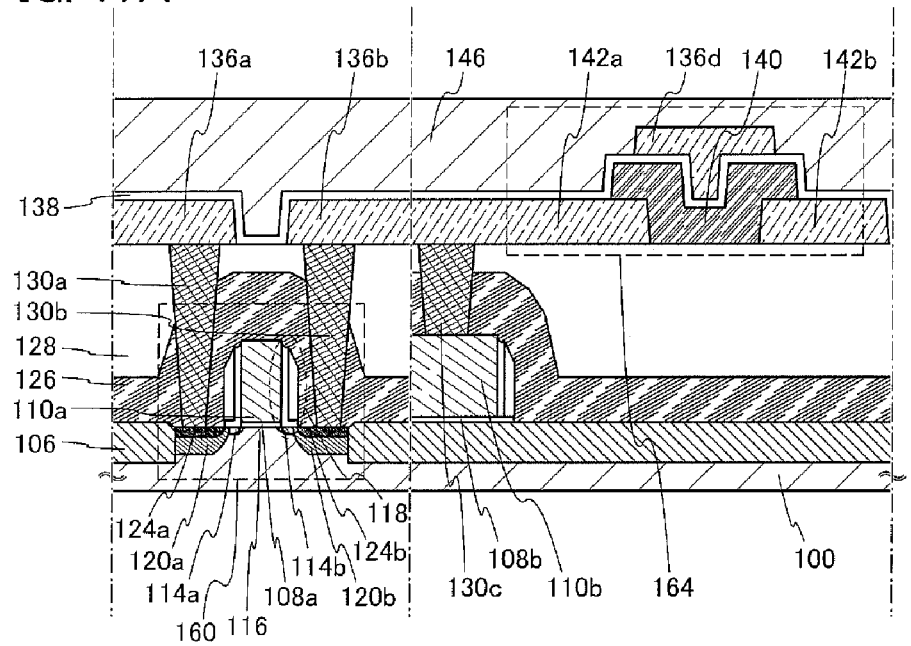
FIGS. 17A and 17B illustrate a semiconductor device according to Embodiment 6.
Figure 17B:
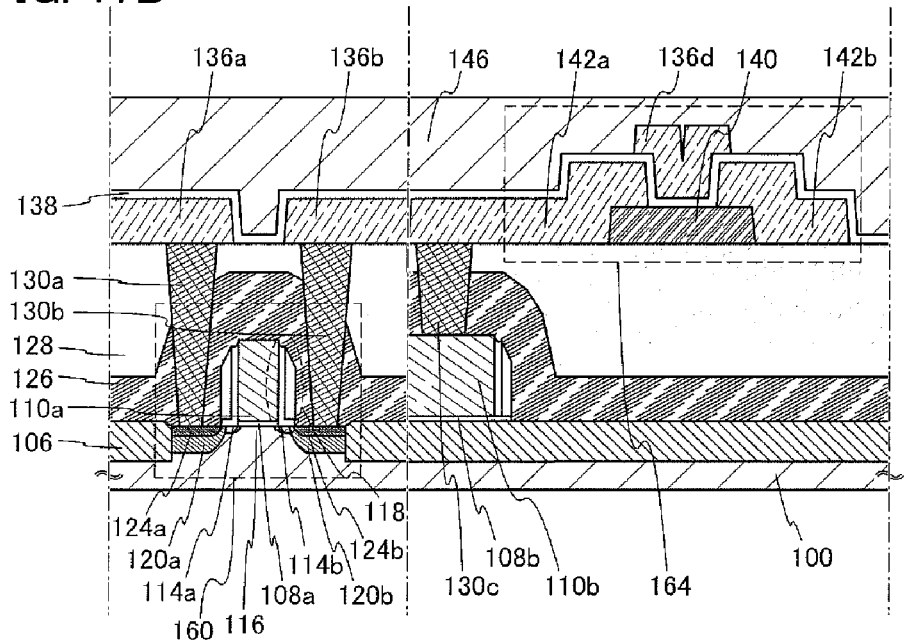

FIGS. 17A and 17B each illustrate the transistor 164 in the case where the size of the element is relatively large and the gate electrode layer 136d is placed over the oxide semiconductor layer 140. Also in this case, a demand for the planarity of a surface and the coverage is relatively moderate, so that a wiring, an electrode, and the like are not necessarily embedded in an insulating layer. For example, the gate electrode layer 136d and the like can be formed by patterning after formation of a conductive layer.

A large difference in structure between FIG. 17A and FIG. 17B is whether the source and drain electrode layers 142a and 142b are in contact with the lower surface or the upper surface of the oxide semiconductor layer 140. Moreover, these differences result in a difference in arrangement of other electrode layers, an insulating layer, and the like. The details of each component are the same as those of FIG. 7 and the like.

Specifically, the transistor 164 illustrated in FIG. 17A includes the source and drain electrode layers 142a and 142b provided over the interlayer insulating layer 128, the oxide semiconductor layer 140 in contact with the upper surfaces of the source and drain electrode layers 142a and 142b, the gate insulating layer 138 provided over the source and drain electrode layers 142a and 142b and the oxide semiconductor layer 140, and the gate electrode layer 136d provided over the gate insulating layer 138 so as to overlap with the oxide semiconductor layer 140.

The transistor 164 illustrated in FIG. 17B includes the oxide semiconductor layer 140 provided over the interlayer insulating layer 128, the source and drain electrode layers 142a and 142b provided to be in contact with the upper surface of the oxide semiconductor layer 140, the gate insulating layer 138 provided over the source and drain electrode layers 142a and 142b and the oxide semiconductor layer 140, and the gate electrode layer 136d provided over the gate insulating layer 138. Note that the gate electrode layer 136d is provided in a region overlapping with the oxide semiconductor layer 140 with the gate insulating layer 138 interposed therebetween.

Note that also in the structures in FIGS. 17A and 17B, a component is sometimes omitted from the structure in FIG. 10 or the like. Also in this case, a secondary effect such as simplification of a manufacturing process can be obtained.

In this embodiment, the example in which the transistor 164 is stacked over the transistor 160 is described; however, the structures of the transistor 160 and the transistor 164 are not limited to the above. For example, a p-channel transistor and an n-channel transistor can be formed over the same planar surface. Further, the transistor 160 and the transistor 164 may be provided to overlap with each other.

The above-described transistor 164 is preferably applied to the transistor 17 included in any of the semiconductor devices described in Embodiments 1 to 5 (see FIGS. 1A to 1C) and the transistor 21 included in any of the semiconductor devices described in Embodiments 2 and 3 (see FIG. 2). The leakage current of the transistor 164 is lower than that of the transistor 160. Accordingly, by applying the transistor 164 to the transistors 17 and 21, a signal can be accurately held in the memory element 15 for an extended period.

All or part of this embodiment can be combined with all or part of another embodiment as appropriate.

Embodiment 7

Figure 18:
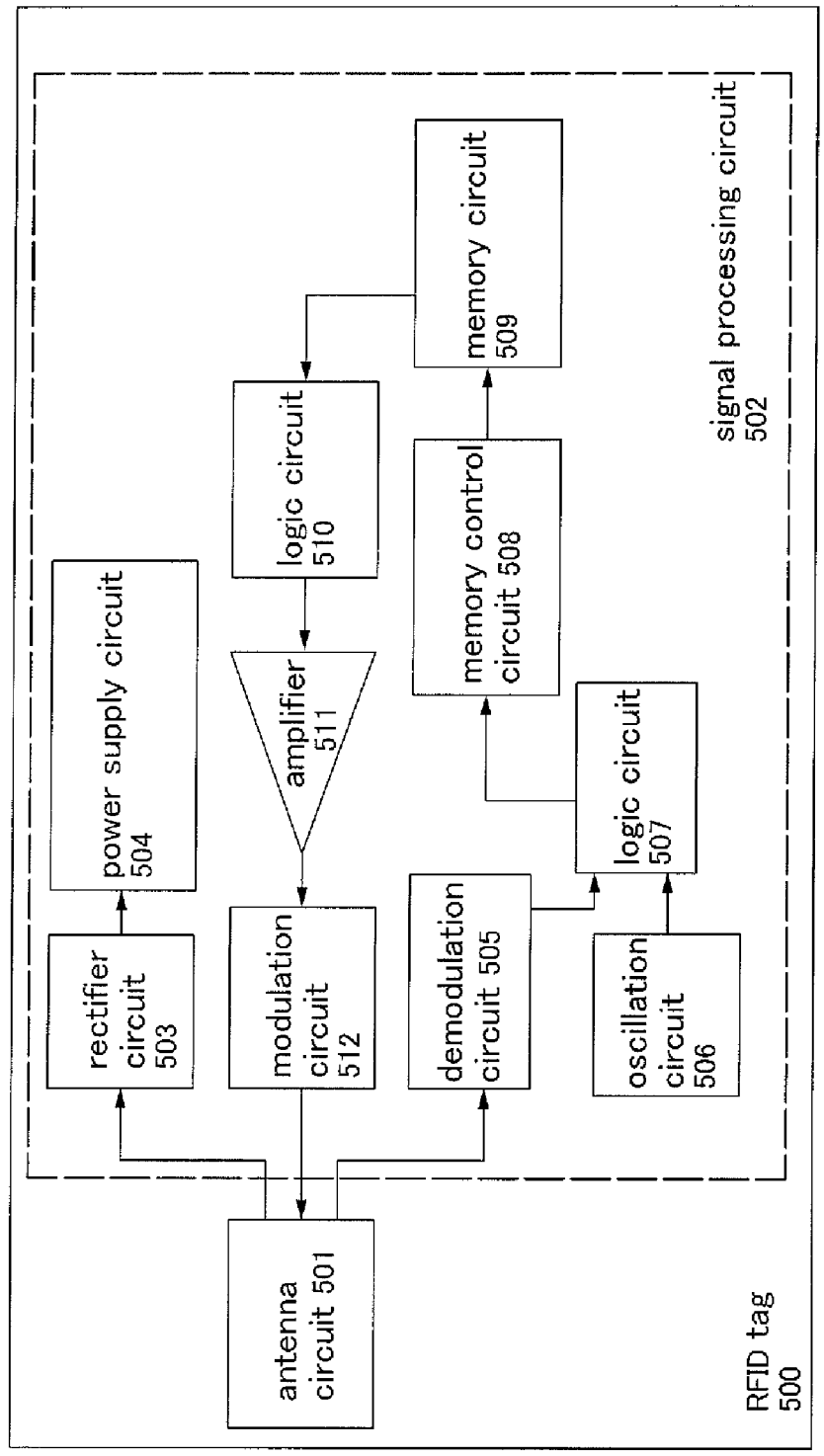
FIG. 18 illustrates an application example of a semiconductor device described in Embodiment 7.

In this embodiment, an RFID (radio frequency identification) tag 500 will be described as an application example of the semiconductor devices having a memory device, which are described in the above embodiments (see FIG. 18).

The RFID tag 500 includes an antenna circuit 501 and a signal processing circuit 502. The signal processing circuit 502 includes a rectifier circuit 503, a power supply circuit 504, a demodulation circuit 505, an oscillation circuit 506, a logic circuit 507, a memory control circuit 508, a memory circuit 509, a logic circuit 510, an amplifier 511, and a modulation circuit 512. The memory circuit 509 includes any of the semiconductor devices described in the above embodiments.

A communication signal received by the antenna circuit 501 is inputted to the demodulation circuit 505. The frequency of a received communication signal, that is, a signal communicated between the antenna circuit 501 and a reader/writer is, for example, 13.56 MHz, 915 MHz, or 2.45 GHz in the ultra high frequency band, which is determined on the basis of the ISO standards or the like. Needless to say, the frequency of the signal communicated between the antenna circuit 501 and the reader/writer is not limited thereto, and for example, any of the following frequencies can be used: a submillimeter wave of 300 GHz to 3 THz; a millimeter wave of 30 GHz to 300 GHz; a microwave of 3 GHz to 30 GHz; an ultra high frequency of 300 MHz to 3 GHz; and a very high frequency of 30 MHz to 300 MHz. Further, a signal communicated between the antenna circuit 501 and a reader/writer is a signal obtained through carrier wave modulation. A carrier wave is modulated by analog modulation or digital modulation, which may employ any of amplitude modulation, phase modulation, frequency modulation, and spread spectrum modulation. Preferably, amplitude modulation or frequency modulation is used.

An oscillation signal outputted from the oscillation circuit 506 is supplied as a clock signal to the logic circuit 507. In addition, the modulated carrier wave is demodulated in the demodulation circuit 505. The signal after demodulation is also transmitted to the logic circuit 507 and analyzed. The signal analyzed in the logic circuit 507 is transmitted to the memory control circuit 508. The memory control circuit 508 controls the memory circuit 509, takes out data stored in the memory circuit 509, and transmits the data to the logic circuit 510. The signal transmitted to the logic circuit 510 is encoded in the logic circuit 510 and amplified in the amplifier 511. With the amplified signal, the modulation circuit 512 modulates a carrier wave. In accordance with the modulated carrier wave, the reader/writer recognizes the signal from the RFID tag 500.

A carrier wave inputted to the rectifier circuit 503 is rectified and then inputted to the power supply circuit 504. A power supply voltage obtained in this manner is supplied from the power supply circuit 504 to the demodulation circuit 505, the oscillation circuit 506, the logic circuit 507, the memory control circuit 508, the memory circuit 509, the logic circuit 510, the amplifier 511, the modulation circuit 512, and the like.

There is no particular limitation on the connection between the signal processing circuit 502 and an antenna in the antenna circuit 501. For example, the antenna and the signal processing circuit 502 are connected by wire bonding or bump connection. Alternatively, the signal processing circuit 502 is formed to have a chip shape and one surface thereof is used as an electrode and attached to the antenna. The signal processing circuit 502 and the antenna can be attached to each other with use of an ACF (anisotropic conductive film).

The antenna is stacked over the same substrate as the signal processing circuit 502, or formed as an external antenna. Needless to say, the antenna is provided above or below the signal processing circuit.

In the rectifier circuit 503, an AC signal that is induced by a carrier wave received by the antenna circuit 501 is converted into a DC signal.

Figure 19:
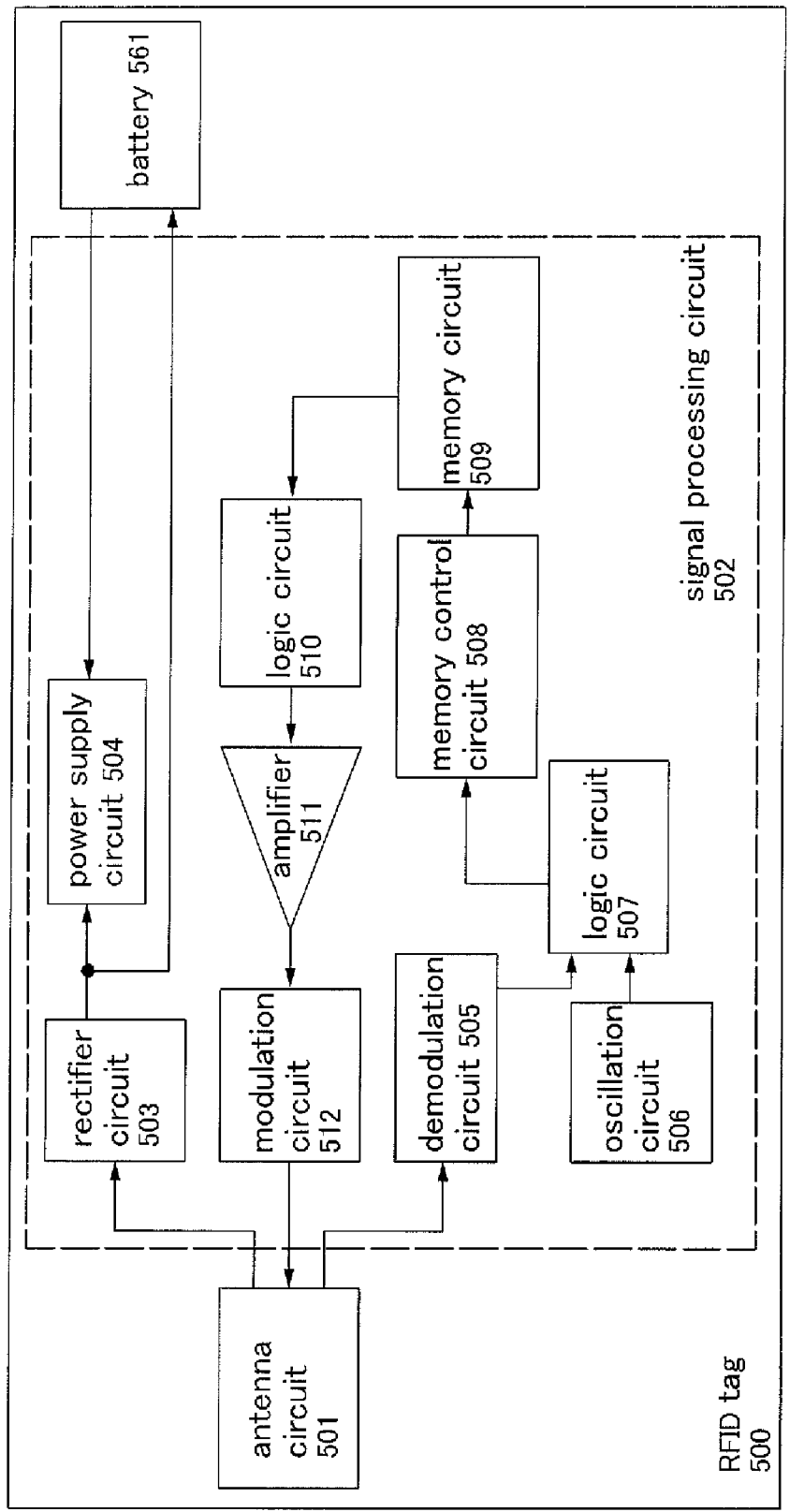
FIG. 19 illustrates an application example of a semiconductor device described in Embodiment 7.

The RFID tag 500 may include a battery 561 (see FIG. 19). When power supply voltage outputted from the rectifier circuit 503 is not high enough to operate the signal processing circuit 502, the battery 561 also supplies power supply voltage to each of the circuits included in the signal processing circuit 502 (the circuits such as the demodulation circuit 505, the oscillation circuit 506, the logic circuit 507, the memory control circuit 508, the memory circuit 509, the logic circuit 510, the amplifier 511, and the modulation circuit 512).

Surplus voltage of the power supply voltage outputted from the rectifier circuit 503 is stored in the battery 561. When an antenna circuit and a rectifier circuit are provided in the RFID tag in addition to the antenna circuit 501 and the rectifier circuit 503, energy stored in the battery 561 can be obtained from electromagnetic waves and the like that are generated randomly.

A battery can be continuously used by charging. As the battery, a battery formed into a sheet form is used. For example, by using a lithium polymer battery that includes a gel electrolyte, a lithium ion battery, a lithium secondary battery, or the like, the size of the battery can be reduced. For example, a nickel metal hydride battery, a nickel cadmium battery, a capacitor having large capacitance, and the like can be given.

Embodiment 8

In this embodiment, application examples of the semiconductor devices described in the above embodiments will be described with reference to FIGS. 20A to 20F.

Figure 20A:
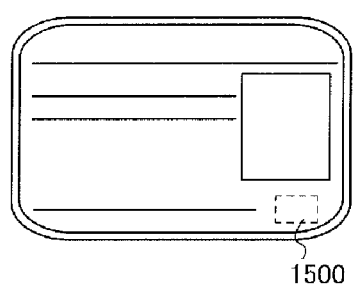
FIGS. 20A to 20F each illustrate an application example of a semiconductor device described in Embodiment 8.
Figure 20B:
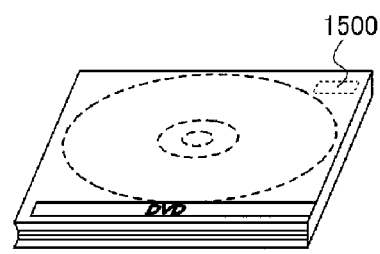
Figure 20C:
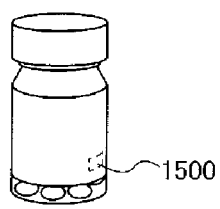
Figure 20D:
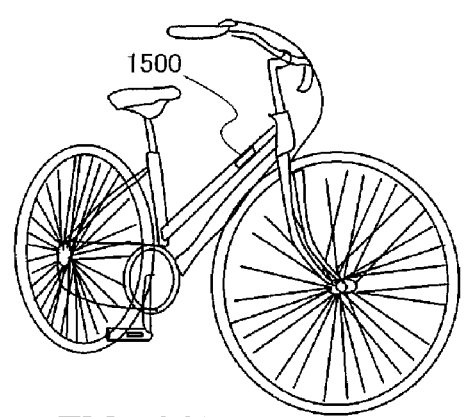
Figure 20E:
Figure 20F:
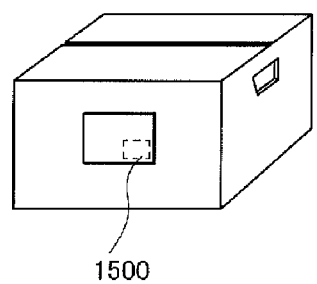

As illustrated in FIGS. 20A to 20F, the semiconductor device can be widely used and provided for, for example, products such as bills, coins, securities, bearer bonds, documents (e.g., driver's licenses or resident's cards, see FIG. 20A), recording media (e.g., DVD software or video tapes, see FIG. 20B), packaging containers (e.g., wrapping paper or bottles, see FIG. 20C), vehicles (e.g., bicycles, see FIG. 20D), personal belongings (e.g., bags or glasses), foods, plants, animals, human bodies, clothing, household goods, and electronic appliances (e.g., liquid crystal display devices, EL display devices, television receivers, or cellular phones), or tags on products (see FIGS. 20E and 20F).

The semiconductor device 1500 is fixed to a product by being mounted on a printed board, attached to a surface of the product, or embedded in the product. For example, the semiconductor device 1500 is fixed to each product by being embedded in paper of a book, or embedded in an organic resin for a package made of the organic resin. Since the semiconductor device 1500 can be reduced in size, thickness, and weight, it can be fixed to a product without spoiling the design of the product. Further, bills, coins, securities, bearer bonds, documents, or the like can have an identification function by being provided with the semiconductor device 1500, and the identification function can be utilized to prevent counterfeiting. Moreover, by attaching the semiconductor device of the present invention to packaging containers, recording media, personal belongings, foods, clothing, household goods, electronic appliances, or the like, a system such as an inspection system can be efficiently used. By attaching the RFID tag 1520 to vehicles, security against theft or the like can be improved.

By thus using any of the semiconductor devices described in the above embodiments for purposes given in this embodiment, data used for data communication can be kept accurate; therefore, authentication, security, or the like of a product can be improved.

This application is based on Japanese Patent Application serial No. 2010-024867 filed with the Japan Patent Office on Feb. 5, 2010, the entire contents of which are hereby incorporated by reference.

The invention claimed is:

1. A semiconductor device comprising:
   a word line;
   a bit line;
   a memory element comprising:
      a transistor; and
      a signal holding portion,
      wherein a gate terminal of the transistor is electrically connected to the word line,
      wherein one of a source terminal and a drain terminal of the transistor is electrically connected to the bit line, and
      wherein the other of the source terminal and the drain terminal of the transistor is electrically connected to the signal holding portion;
   a capacitor being capable of holding a potential of the gate terminal of the transistor, wherein a first terminal of the capacitor is electrically connected to the word line;
   a word line driver circuit configured to control a potential of a second terminal of the capacitor; and
   a bit line driver circuit configured to control a potential of the bit line.

2. The semiconductor device according to claim 1, further comprising a switch,
   wherein a first terminal of the switch is electrically connected to the word line and a second terminal of the switch is electrically connected to a power supply circuit.

3. The semiconductor device according to claim 2, wherein the switch is a second transistor.

4. The semiconductor device according to claim 1, wherein the signal holding portion comprises a second transistor and a second capacitor.

5. The semiconductor device according to claim 1, wherein the word line is negatively charged.

6. The semiconductor device according to claim 1, wherein the transistor comprises an oxide semiconductor.

7. An electronic device comprising the semiconductor device according to claim 1, wherein the electronic device is selected from the group consisting of a liquid crystal display device, an EL display device, a television receiver, and a cellular phone.

8. A semiconductor device comprising:
   a word line;
   a bit line;
   a memory element comprising:
      a first transistor; and
      a signal holding portion,
      wherein a gate terminal of the first transistor is electrically connected to the word line,
      wherein one of a source terminal and a drain terminal of the first transistor is electrically connected to the bit line, and wherein the other of the source terminal and the drain terminal of the first transistor is electrically connected to the signal holding portion;

a capacitor being capable of holding a potential of the gate terminal of the first transistor, wherein a first terminal of the capacitor is electrically connected to the word line;

a word line driver circuit configured to control a potential of a second terminal of the capacitor;

a bit line driver circuit configured to control a potential of the bit line; and a second transistor, wherein one of a source terminal and a drain terminal of the second transistor is electrically connected to the word line.

9. The semiconductor device according to claim 8, further comprising:

a first power supply circuit;

a second power supply circuit;

a first switch,
wherein a first terminal of the first switch is electrically connected to a gate terminal of the second transistor, and
wherein a second terminal of the first switch is electrically connected to the first power supply circuit; and a second switch,
wherein a first terminal of the second switch electrically connected to the other of the source terminal and the drain terminal of the second transistor, and
wherein a second terminal of the second switch electrically connected to the second power supply circuit.

10. The semiconductor device according to claim 9, wherein the first switch is a third transistor, and
wherein the second switch is a fourth transistor.

11. The semiconductor device according to claim 8, wherein the signal holding portion comprises a third transistor and a second capacitor.

12. The semiconductor device according to claim 8, wherein the word line is negatively charged.

13. The semiconductor device according to claim 8, wherein the first transistor and the second transistor each comprise an oxide semiconductor.

14. An electronic device comprising the semiconductor device according to claim 8, wherein the electronic device is selected from the group consisting of a liquid crystal display device, an EL display device, a television receiver, and a cellular phone.

* * * * *